United States Patent
Haukness et al.

(10) Patent No.: US 8,300,477 B2
(45) Date of Patent: Oct. 30, 2012

(54) PIECEWISE ERASURE OF FLASH MEMORY

(75) Inventors: Brent S. Haukness, Monte Sereno, CA (US); Ian Shaeffer, Los Gatos, CA (US); Gary B. Bronner, Los Altos, CA (US)

(73) Assignee: Rambus, Inc., Sunnyvale, CA (US)

( * ) Notice: Subject to any disclaimer, the term of this patent is extended or adjusted under 35 U.S.C. 154(b) by 246 days.

(21) Appl. No.: 12/920,564

(22) PCT Filed: Feb. 19, 2009

(86) PCT No.: PCT/US2009/034491
§ 371 (c)(1),
(2), (4) Date: Sep. 1, 2010

(87) PCT Pub. No.: WO2009/111174
PCT Pub. Date: Sep. 11, 2009

(65) Prior Publication Data
US 2011/0004726 A1    Jan. 6, 2011

Related U.S. Application Data

(60) Provisional application No. 61/033,227, filed on Mar. 3, 2008.

(51) Int. Cl.
*G11C 11/34* (2006.01)
*G11C 16/04* (2006.01)
*G11C 7/00* (2006.01)
*G11C 8/00* (2006.01)

(52) U.S. Cl. ............... 365/185.29; 365/191; 365/230.06
(58) Field of Classification Search ............. 365/185.29, 365/191, 230.06
See application file for complete search history.

(56) References Cited

U.S. PATENT DOCUMENTS

| | | | |
|---|---|---|---|
| 5,053,990 A | 10/1991 | Kreifels | |
| 6,421,276 B1 | 7/2002 | Goltman | |
| 7,564,721 B2* | 7/2009 | Roohparvar | 365/185.33 |
| 2001/0038318 A1 | 11/2001 | Johnson | |
| 2002/0150070 A1 | 10/2002 | Shattil | |
| 2007/0147121 A1* | 6/2007 | Futatsuyama | 365/185.17 |
| 2009/0097324 A1* | 4/2009 | Bode | 365/185.21 |

FOREIGN PATENT DOCUMENTS

| | | |
|---|---|---|
| EP | 1229342 A2 | 8/2002 |
| EP | 1267501 A3 | 11/2003 |
| EP | 1717969 A2 | 11/2006 |

* cited by examiner

Primary Examiner — Ly D Pham
(74) Attorney, Agent, or Firm — Stolowitz Ford Cowger LLP

(57) ABSTRACT

Embodiments of a circuit are described. This circuit includes control logic that generates multiple piecewise-erase commands to erase information stored in a storage cell of a memory device formed within another circuit. Note that execution of a single one of the multiple piecewise-erase commands within the memory device may be insufficient to erase the information stored in the storage cell. Moreover, the first circuit includes an interface that receives the multiple piecewise-erase commands from the control logic and that transmits the multiple piecewise-erase commands to the memory device.

26 Claims, 17 Drawing Sheets

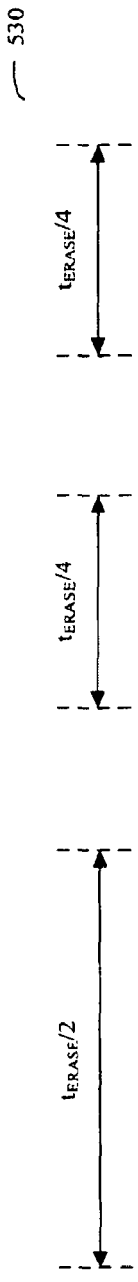
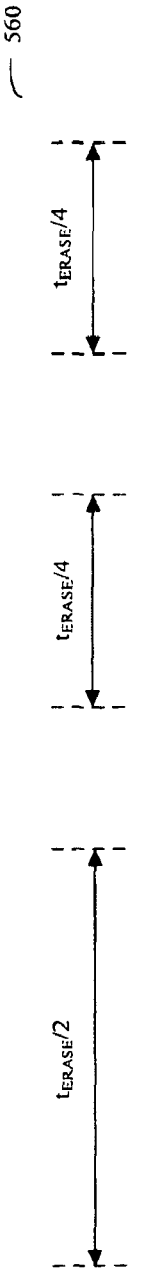
FIG. 4A
FIG. 4B
FIG. 4C

```
                                                                    ┌── 600
┌─────────────────────────────────────────────────────────────────┐
│ GENERATE MULTIPLE PIECEWISE ERASE COMMANDS TO ERASE INFORMATION │
│    STORED IN A STORAGE CELL FORMED WITHIN ANOTHER MEMORY        │
│   COMPONENT, WHERE EXECUTION OF A SINGLE ONE OF THE MULTIPLE    │
│    PIECEWISE ERASE COMMANDS WITHIN THE OTHER MEMORY COMPONENT   │
│   MAY BE INSUFFICIENT TO ERASE THE INFORMATION STORED IN THE    │
│                          STORAGE CELL                           │
│                              610                                │
└─────────────────────────────────────────────────────────────────┘
                                  │
                                  ▼
┌─────────────────────────────────────────────────────────────────┐
│     TRANSMIT THE MULTIPLE PIECEWISE ERASE COMMANDS TO THE       │
│                     OTHER MEMORY COMPONENT                      │
│                              612                                │
└─────────────────────────────────────────────────────────────────┘
                                  │
                                  ▼
┌─────────────────────────────────────────────────────────────────┐
│   DETERMINE IF ERASURE OF THE INFORMATION IN THE STORAGE CELL   │
│                           IS COMPLETE                           │
│                            (OPTIONAL)                           │
│                              614                                │
└─────────────────────────────────────────────────────────────────┘
```

```
RECEIVE AN ERASE COMMAND ASSOCIATED WITH A *NAND* FLASH STORAGE
CELL IN A MEMORY COMPONENT, WHERE THE ERASE COMMAND IS RECEIVED
FROM ANOTHER MEMORY COMPONENT
670
```

↓

```
EXECUTE THE ERASE COMMAND AS MULTIPLE PIECEWISE ERASE COMMANDS,
WHERE EXECUTION OF THE MULTIPLE PIECEWISE ERASE COMMANDS MAY BE
SUFFICIENT TO ERASE INFORMATION STORED IN THE *NAND* FLASH STORAGE
CELL BUT A GIVEN PIECEWISE ERASE COMMAND MAY BE INSUFFICIENT TO
ERASE THE INFORMATION STORED IN THE *NAND* FLASH STORAGE CELL
672
```

FIG. 5D

PIECEWISE ERASURE OF FLASH MEMORY

FIELD

The present embodiments relate to memory. More specifically, the present embodiments relate to circuits and methods for piecewise erasure of information stored in memory.

BRIEF DESCRIPTION OF THE FIGURES

FIG. 4A is a timing diagram illustrating an embodiment of a piecewise-erase operation.

FIG. 4B is a timing diagram illustrating an embodiment of a piecewise-erase operation.

FIG. 4C is a timing diagram illustrating an embodiment of a piecewise-erase operation.

FIG. 5A is a flow chart illustrating an embodiment of a process for communicating piecewise-erase commands.

FIG. 5D is a flow chart illustrating an embodiment of a process for executing piecewise-erase commands.

Note that like reference numerals refer to corresponding parts throughout the drawings.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

In the discussion that follows, multiple piecewise-erase commands are used to erase information stored in a storage cell in a memory device, such as Flash memory, thereby reducing the impact of long erase time duration. In contrast with an existing erase command (which is henceforth referred to as an erase command), note that execution of a single one of the multiple piecewise-erase commands within the memory device is insufficient to erase the information stored in the storage cell. However, execution of the multiple piecewise-erase commands (over time) is sufficient to erase information stored in the storage cell. In some embodiments, the multiple piecewise-erase commands are executed serially over time, e.g., intervening commands may be executed after a given piecewise-erase command has been executed and before a subsequent piecewise-erase command is executed. By allowing data to be read or written to another storage cell while the storage cell is being erased, this technique improves the performance of memory devices, such as Flash memory. This increase in performance may allow these memory devices to be used in additional storage applications, such as, computer main memory.

Figure 1:
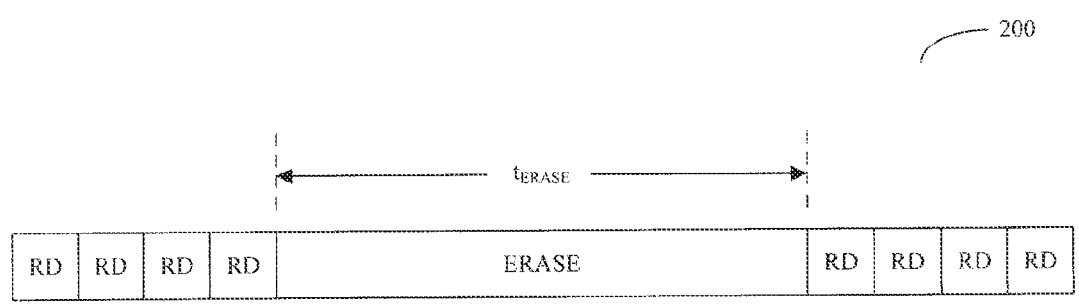
FIG. 1 is a timing diagram illustrating an embodiment of an erase operation.

Many existing memory devices use a single, long erase time duration ($t_{ERASE}$) to ensure complete erasure of one or more storage cells. This is shown in FIG. 1, which presents a timing diagram illustrating an embodiment 200 of an erase operation. Note that this erase time duration may be very long compared to other operations, such as read operations (RD). For example, the erase time duration may be 1-2 ms versus 20-40 μs for a read operation.

Moreover, the erase operation may be performed on at least a group of storage cells, such as: a page of storage cells, a string of storage cells, and/or a block of storage cells. Consequently, the memory array containing the group of storage cells or the entire memory device may be unavailable until the erase operation is completed. Because the erase time duration can be long, this may reduce the performance of these memory devices.

Figure 3A:
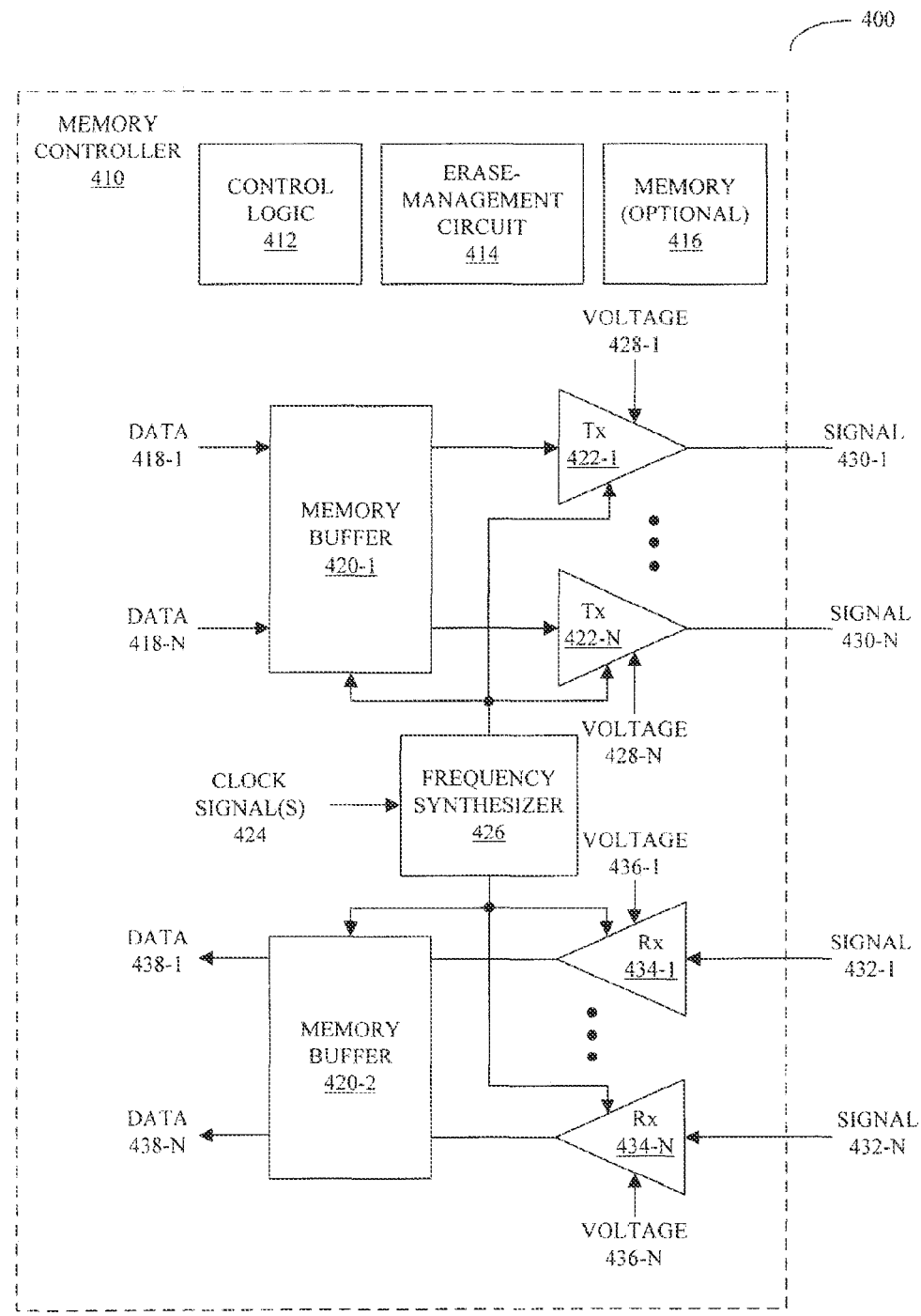
FIG. 3A is a block diagram illustrating an embodiment of a memory controller.

In contrast, as noted above, this performance problem may be addressed by using multiple piecewise-erase commands in accordance with the embodiments disclosed herein. This is shown in FIG. 3A, which presents a block diagram illustrating an embodiment 400 of a memory controller 410. In this memory controller, control logic 412 may generate multiple piecewise-erase commands to erase information stored in a given storage cell (such as Flash memory) of a memory device formed within another circuit. For example, rather than issue a single erase command that may be sufficient to erase the given storage cell, control logic 412 may issue multiple piecewise-erase commands, each of which may be insufficient to erase the given storage cell, but which, after execution of two or more of the piecewise-erase commands may be sufficient to erase the given storage cell. Consequently, an erase time duration associated with the given piecewise-erase command may be less than a total erase time duration used to erase the storage cell.

Figure 3B:
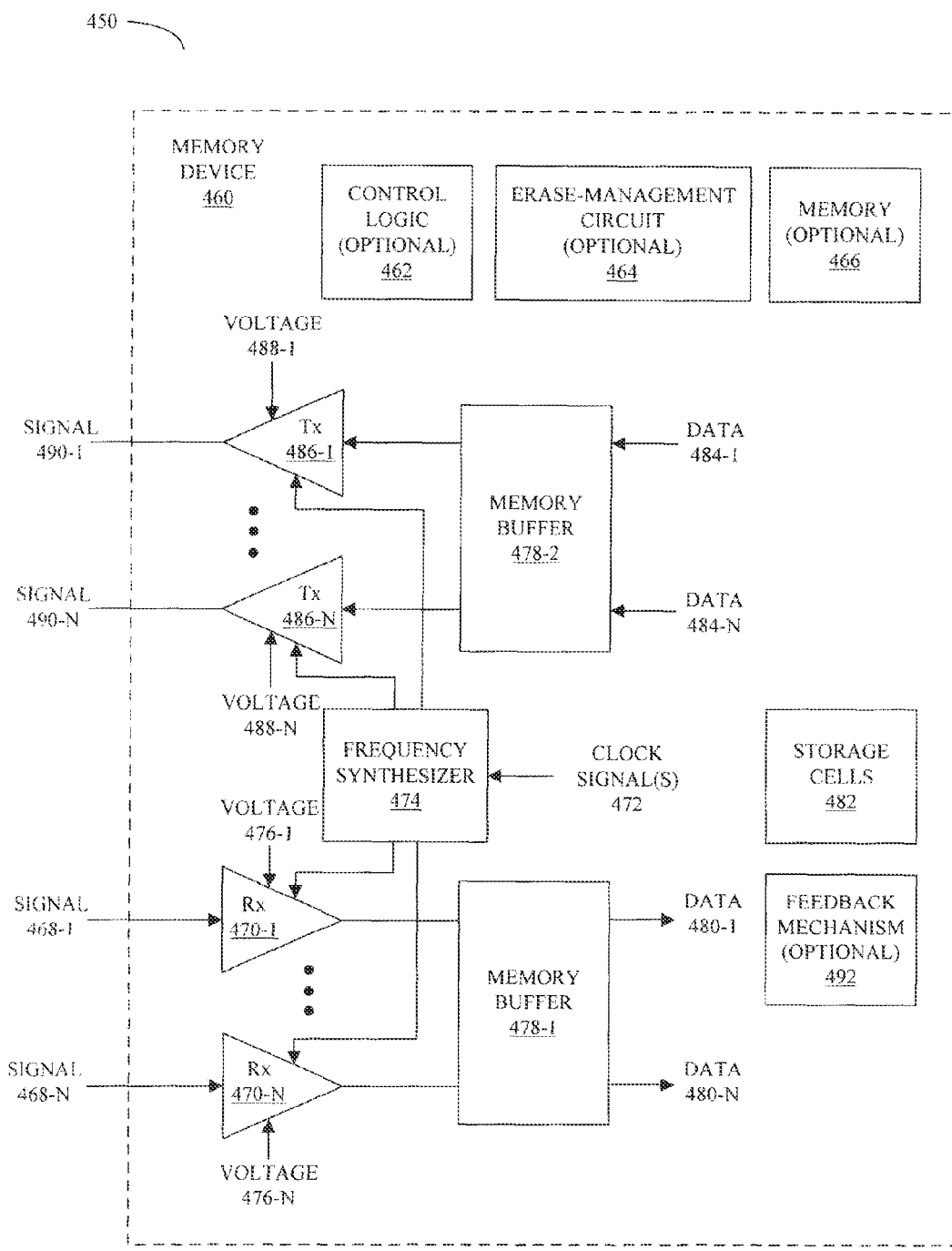
FIG. 3B is a block diagram illustrating an embodiment of a memory device.

Moreover, the erase time duration associated with the given piecewise-erase command may be fixed (as described further below with reference to FIG. 4A). However, in some embodiments the erase time duration associated with the given piecewise-erase command is variable (as described further below with reference to FIG. 4B). Note that control logic 412 may issue a fixed number of piecewise-erase commands to erase the given storage cell. Additionally, in some embodiments there may be a maximum number of piecewise-erase commands associated with the given storage cell, and the erase operation may be deemed to have failed when this limit is reached. This maximum value may be pre-defined or programmable, and may be stored in a register, such as in optional memory 416 and/or optional memory 466 (FIG. 3B).

In some embodiments, the given piecewise-erase command includes information about the corresponding erase time duration. Alternatively, the erase time duration associated with the given piecewise-erase command may specified by a register setting in a memory device (as described further below with reference to FIG. 3B).

Memory controller 410 may include an erase-management circuit 414, which may monitor or track an erase state of the given storage cell. For example, erase-management circuit 414: may track a number of piecewise-erase commands associated with the given storage cell that have been issued or executed; and/or may track a total erase time or erase time duration of the given storage cell based on the piecewise-erase commands that have been issued or executed. As described further below with reference to FIG. 3B, in some embodiments erase-management circuit 414 may track an erase progress of the given storage cell, for example, based on a feedback mechanism that monitors the erase state of the given storage cell. Consequently, the piecewise erasure of the given storage cell may be open or closed loop. Note that erase-management circuit 414 may maintain an erase management table that indicates the erase state of the given storage cell, such as completely erased or if erasure is in progress.

In some embodiments, memory controller 410 verifies that erasure of the given storage cell is complete (for example, using the feedback mechanism) after a certain number of piecewise-erase commands have been executed. Moreover, in some embodiments memory controller 410 issues multiple piecewise-erase commands to erase information stored in the given storage cell and checks the erase status after each piecewise-erase command is executed until the erase operation is completed.

Control logic 412 may generate an additional command that is transmitted to the memory device prior to the occurrence of an erase-complete condition. This additional command may interrupt an erase operation (which may be a piecewise-erase operation) in progress in the memory device when the additional command is executed by the memory device. For example, the additional command may be an erase-interrupt command (as described below with reference to FIG. 4C). However, in some embodiments the additional command indirectly interrupts the erase in progress. For example, the additional command may have a higher priority than the erase in progress, which may lead the memory device to interrupt the erase in progress. Note that the erase-complete condition may include receipt of an erase-complete indicator from the memory device or a pre-determined time since the multiple piecewise-erase commands were transmitted to the memory device (which is sufficient for the memory device to process multiple piecewise-erase commands).

In some embodiments, an operation mode of the control logic 412 is selectable. In one operation mode, the control logic 412 may generate the multiple piecewise-erase commands. In another operation mode, the control logic 412 may generate a single erase command, execution of which within the memory device may be sufficient to erase the given storage cell. Consequently, the memory controller 410 may also issue programming commands to the memory device based on the current operation mode of the control logic 412. These programming commands may set a corresponding operation mode of the memory device. Thus, the programming commands may transition the memory device from one operation mode to another operation mode.

While the preceding discussion describes the memory controller 410 issuing multiple piecewise-erase commands (at least in one operation mode), in some embodiments the memory controller 410 only issues a single erase command for the given storage cell. As described below with reference to FIG. 3B, in these embodiments the memory device may process the single erase command using multiple piecewise-erase commands.

FIG. 3B presents a block diagram illustrating an embodiment 450 of a memory device 460. This memory device may include optional control logic 462. Moreover, this control logic may receive and execute multiple piecewise-erase commands associated with a given storage cell from a memory controller.

As noted previously, the erase duration associated with the given piecewise-erase command may be fixed or variable. In some embodiments, the given piecewise-erase command may include information associated with the erase time duration. Alternatively, the erase time duration may be specified by a setting in a register, such as optional memory 466.

Memory device 460 may include an optional erase-management circuit 464, which may monitor or track an erase state of the given storage cell. For example, optional erase-management circuit 464: may track a number of piecewise-erase commands associated with the given storage cell that have been received or executed; and/or may track a total erase time or erase time duration of the given storage cell based on the piecewise-erase commands that have been received or executed. For example, in some embodiments optional erase-management circuit 464 may track an erase progress of the given storage cell based on an optional feedback mechanism 492 that monitors the erase state of the given storage cell. Consequently, the piecewise erasure of the given storage cell may be open or closed loop. Note that optional erase-management circuit 464 may maintain an erase management table that indicates the erase state of the given storage cell, such as completely erased or if erasure is in progress.

In some embodiments, feedback mechanism 492 (or optional control logic 462) sets a register bit to indicate completion of the erasure of the information. Moreover, the feedback mechanism 492 (or optional control logic 462) may indicate that the erasure of the information is complete via a link in a channel that is coupled to memory controller 410 (FIG. 3A).

As noted previously, in some embodiments memory device 460 receives an additional command that optional control logic 462 executes prior to completing the multiple piecewise-erase commands, thereby interrupting an erase in progress. For example, the additional command may be an erase-interrupt command or may have a higher priority than the multiple piecewise-erase commands.

Moreover, in some embodiments optional control logic 462 receives programming commands that set an operation mode of the memory device 460. For example, in one operation mode the optional control logic 462 processes and executes multiple piecewise-erase commands, and in another operation mode the optional control logic 462 processes and executes a single erase command that may be sufficient to erase the given storage cell.

Additionally, as noted previously, in some embodiments optional control logic 462 receives a single erase command for the given storage cell, which the optional control logic 462 executes as multiple piecewise-erase commands. For example, this processing technique may be used when the storage cells 482 include a NAND Flash storage cell. Additionally, in some embodiments the optional control logic 462 inserts and executes additional commands (other than piecewise-erase commands to the given storage cell) to the same memory bank between the multiple piecewise-erase commands.

In some embodiments, optional control logic 462 includes the functionality of a memory controller. Thus, in some embodiments the memory device 460 includes a memory module and a memory controller. These components may be included in a chip package on one or more integrated circuits. For example, the chip package may include a first integrated circuit that includes the memory controller and a second integrated circuit that include the memory module. As noted previously, the memory controller may be a local memory controller and/or a system memory controller.

While piecewise erasure of Flash memory has been used as an illustration in the preceding discussion, in other embodiments the piecewise-erase technique may be applied to a variety of memory devices, such as resistance-change memory (such as RRAM) and/or phase-change memory (PCM).

We now describe embodiments of piecewise-erase operations. FIG. 4A presents a timing diagram illustrating an embodiment 500 of a piecewise-erase operation of one or more storage cells, for example, in a memory block. These one or more storage cells are sometimes referred to as an erasure target or an erase block.

Note that these piecewise-erase operations may each have a fixed time duration that is a fixed fraction or percentage (such as 25%) of the erase time duration ($t_{ERASE}$) of a single erase operation. Moreover, the total erase duration required to complete the erase operation includes the time interval from the start of the first piecewise-erase operation to the completion of the last piecewise-erase operation.

Additionally, a given piecewise-erase operation corresponds to a time interval that is referred to as an erase duration. Furthermore, an intervening operation, such as a read (RD) operation, may be directed to a memory block other than the erasure target and may be executed within a time interval that includes multiple piecewise-erase commands that correspond to the total erase duration. For example, a given intervening operation may occur between two piecewise-erase operations or concurrently with at least one piecewise-erase operation.

In embodiment 500, a specified number of piecewise-erase operations may be performed on the given storage cell before the erase is complete. In this way, a memory component, such as a memory controller, can intersperse piecewise-erase commands with other commands to a particular bank, plane and/or device.

However, in other embodiments the piecewise-erase operations may have variable time durations. This is shown in FIG. 4B, which presents a timing diagram illustrating an embodiment 530 of a piecewise-erase operation. Note that a given one of these piecewise-erase operations may specify an associated time duration (for example, a fraction or a percentage of a single erase time duration). Moreover, note that a total erase time duration would be specified, and that in order to erase the given storage cell the piecewise-erase operations would have to achieve this total erase time duration. This configuration gives a memory component, such as a memory controller, the flexibility to schedule a longer time-duration piecewise-erase command if a bank is not needed for other operations or to intersperse short time-duration piecewise-erase commands if other operations need to be performed.

Moreover, in some embodiments an erase in progress may be interrupted either by an erase-interrupt command or by a higher priority command. An erase-interrupt command (EI) is shown in FIG. 4C, which presents a timing diagram illustrating an embodiment 560 of a piecewise-erase operation. Note that the erase operation can be continued later after the erase interrupt or a higher priority command has been executed, for example, when another erase or piecewise-erase command is subsequently executed. Moreover, note that EIs in embodiment 560 only interrupt the first two piecewise-erase operations because the total erase duration has been achieved at the conclusion of the third piecewise-erase operation. In some embodiments, a given piecewise-erase operation is interrupted without issuing an EI command. For example, a higher-priority command other than a piecewise-erase command (such as a RD command) that is received during the given piecewise-erase operation may lead to an interruption.

In this embodiment, an erase-management circuit, such as erase-management circuits 414 (FIG. 3A) and/or 464 (FIG. 3B), can track how much of the erase operation is remaining (for example, based on an executed erase time duration or feedback from a feedback mechanism). In this way, the piecewise-erase operations can continue from a known erase state.

In some embodiments, embodiments 500 (FIG. 4A), 530 (FIG. 4B) and/or 560 include fewer or additional components. Moreover, two or more components can be combined into a single component, and/or a position of one or more components may be changed.

Embodiments of one or more circuits, an integrated circuit that includes at least one of the one or more circuits, a memory device that includes at least one of the one or more circuits, a memory controller that includes at least one of the one or more circuits, a system that includes a transmitter (such as the memory controller 410 in FIG. 3A) and a receiver (such as the memory device 460 in FIG. 3B), a technique for communicating one or more piecewise-erase commands, and a technique for executing an erase command (such as a piecewise-erase command) are described. As described previously, this memory controller may provide multiple piecewise-erase commands to erase information stored in a storage cell of the memory device. Moreover, in some embodiments the memory control provides an erase command (which may be an erase command or a piecewise-erase command) and, then, additional command to the memory device prior to the occurrence of an erase-complete condition. Note that the additional command may, directly or indirectly, interrupt an erase in progress in the memory device.

Similarly, the memory device may include control logic that executes the multiple piecewise-erase commands. Moreover, the memory device may include a NAND Flash storage cell, and when an erase command is received, control logic in the memory device may execute the erase command as multiple piecewise-erase commands.

Embodiments of one or more of these circuits, integrated circuits, devices, systems and/or techniques may be used in memory systems and/or memory devices that include different types of memory, such as: volatile memory, non-volatile memory, erasable programmable read-only memory (EPROM), electrically erasable programmable read-only memory (EEPROM), NAND or NOR Flash, a fully buffered NAND Flash memory module, solid-state memory, resistance-change memory (such as RRAM), phase-change memory (PCM), and/or another type of memory. Moreover, for a given type of memory, these techniques may be used in different memory technologies or technology generations (which may use different power supply voltages).

Consequently, memory components (such as a memory controller, a memory device, a memory module, and/or a memory system) that use these techniques may be included in a wide variety of applications, such as: desktop or laptop computers, computer systems, hand-held or portable devices (such as personal digital assistants and/or cellular telephones), set-top boxes, home networks, and/or video-game devices. For example, a storage device (such as the memory module) may be included in computer main memory. Moreover, one or more of these embodiments may be included in a communication system, such as: serial or parallel links, metropolitan area networks (such as WiMax), local area networks (LANs), wireless local area networks (WLANs), personal area networks (PANs), and/or wireless personal area networks (WPANs).

Figure 2:
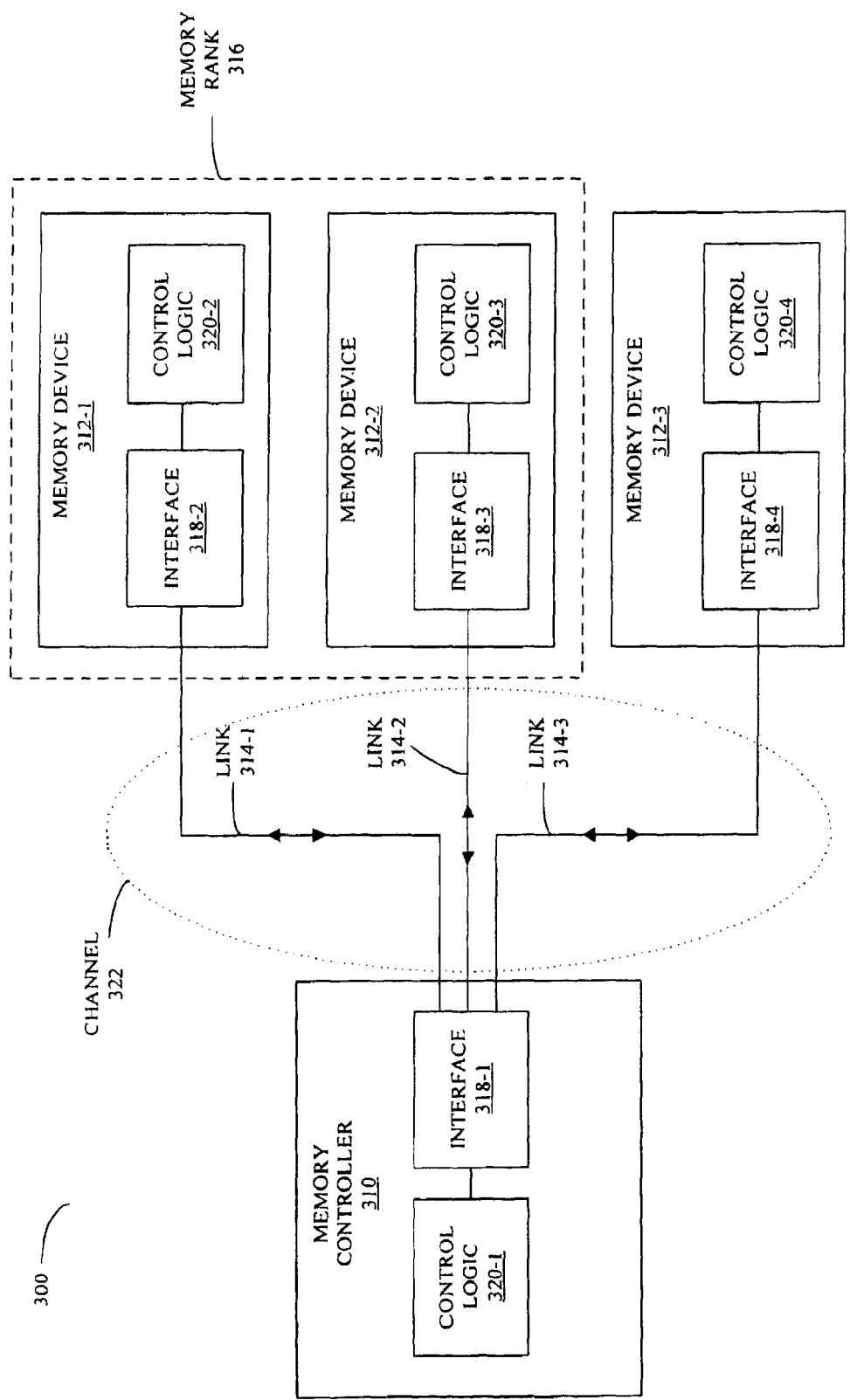
FIG. 2 is a block diagram illustrating an embodiment of a memory system.

We now describe embodiments of circuits, devices and systems that piecewise erase stored data. FIG. 2 presents a block diagram illustrating an embodiment of a memory system 300. This memory system includes at least one memory controller 310 (such as memory controller 410 in FIG. 3A) and one or more memory devices 312 (for example, memory device 460 in FIG. 3B), such as one or more memory modules. While FIG. 2 illustrates memory system 300 having one memory controller 310 and three memory devices 312, other embodiments may have additional memory controllers and fewer or more memory devices 312. Moreover, while memory system 300 illustrates memory controller 310 coupled to multiple memory devices 312, in other embodiments two or more memory controllers may be coupled to one another. Note that memory controller 310 and one or more of the memory devices 312 may be implemented on the same or different integrated circuits, and that these one or more integrated circuits may be included in a chip-package.

In some embodiments, the memory controller 310 is a local memory controller (such as a Flash memory controller) and/or is a system memory controller (which may be implemented in a microprocessor or another chip in a chipset, such as a northbridge chip). Either a local memory controller and/or a system memory controller may provide piecewise-erase commands to a memory device, such as memory device 312-1.

Memory controller 310 may include an I/O interface 318-1 and control logic 320-1. Control logic 320-1 may be used to encode data for transmission by the interface 318-1 to one or more of the memory devices 312 and/or to decode data received by the interface 318-1 from one or more of the memory devices 312 (for example, using a modulation code).

In some embodiments, one or more of memory devices 312 include control logic 320 and at least one of interfaces 318. However, in some embodiments some of the memory devices 312 may not have control logic 320. Moreover, memory controller 310 and/or one or more of memory devices 312 may include more than one of the interfaces 318, and these interfaces may share one or more control logic 320 circuits. Note that in some embodiments two or more of the memory devices 312, such as memory devices 312-1 and 312-2, may be configured as a memory rank 316.

Memory controller 310 and memory devices 312 are coupled by one or more links 314 in a channel 322. While memory system 300 illustrates three links 314, other embodiments may have fewer or more links 314. These links may include: wired, wireless and/or optical communication. Moreover, links 314 may be used for bi-directional and/or uni-directional communications between the memory controller 310 and one or more of the memory devices 312. For example, bi-directional communication between the memory controller 310 and a given memory device may be simultaneous (full-duplex communication). Alternatively, the memory controller 310 may transmit information (such as a data packet which includes a command) to the given memory device, and the given memory device may subsequently provide requested data to the memory controller 310, e.g., a communication direction on one or more of the links 314 may alternate (half-duplex communication). Note that one or more of the links 314 and corresponding transmit circuits (which are illustrated in FIGS. 3A and 3B) and/or receive circuits (which are illustrated in FIGS. 3A and 3B) may be dynamically configured, for example, by one of the control logic 320 circuits, for bi-directional and/or unidirectional communication.

In some embodiments, data may be communicated on one or more of the links 314 using one or more sub-channels associated with one or more carrier frequencies $f_i$. Moreover, a given sub-channel may have an associated: range of frequencies, a frequency band, or groups of frequency bands (henceforth referred to as a frequency band).

Signals carried on these sub-channels may be: time-multiplexed, frequency multiplexed, and/or encoded. Thus, in some embodiments the signals are encoded using: time division multiple access, frequency division multiple access, and/or code division multiple access. Moreover, in some embodiments signals are communicated on the links 314 using discrete multi-tone communication (such as Orthogonal Frequency Division Multiplexing).

Moreover, the data communicated on links 314 may be modulation coded. This modulation coding may include spread-spectrum encoding, for example, coding based on: binary pseudorandom sequences (such as maximal length sequences or m-sequences), Gold codes, and/or Kasami sequences. Moreover, modulation coding may include bit-to-symbol coding in which one or more data bits are mapped together to a data symbol, and symbol-to-bit coding in which one or more symbols are mapped to data bits. For example, a group of two data bits can be mapped to: one of four different amplitudes of an encoded data signal; one of four different phases of a sinusoid; or a combination of one of two different amplitudes of a sinusoid and one of two different phases of the same sinusoid (such as in quadrature amplitude modulation or QAM).

In general, the modulation coding may include: amplitude modulation, phase modulation, and/or frequency modulation, such as pulse amplitude modulation (PAM), pulse width modulation, and/or pulse code modulation. For example, the modulation coding may include: two-level pulse amplitude modulation (2-PAM), three-level pulse amplitude modulation (3-PAM), four-level pulse amplitude modulation (4-PAM), eight-level pulse amplitude modulation (8-PAM), sixteen-level pulse amplitude modulation (16-PAM), two-level on-off keying (2-OOK), four-level on-off keying (4-OOK), eight-level on-off keying (8-OOK), and/or sixteen-level on-off keying (16-OOK).

In some embodiments, the modulation coding includes non-return-to-zero (NRZ) coding. Moreover, in some embodiments the modulation coding includes two-or-more-level QAM. Note that the different sub-channels communicated on the links 314 may be encoded differently and/or the modulation coding may be dynamically adjusted. As described further below with reference to FIGS. 3A and 3B, this adjustment may be based on a performance metric associated with communication on one or more of the links 314.

Continuing the discussion of FIG. 3A, data 418 to be transmitted by the memory controller 410 to a memory device (such as a Flash memory device) may be temporarily stored in memory buffer 420-1. Then, the data 418 may be forwarded to transmit circuits (Tx) 422, and may be transmitted as (analog or digital) signals 430.

Similarly, signals 432 may be received from the memory device using receive circuits (Rx) 434, which include detection circuits (such as slicer circuits) to determine data 438 from the signals 432. In some embodiments, data 438 is temporarily stored in memory buffer 420-2. Additionally, note that in some embodiments signals 430 and 432 are transmitted and received on the same link (such as a bidirectional link).

Note that timing of the forwarding, receiving, and/or transmitting may be gated by one or more timing signals provided by frequency synthesizer 426. Consequently, signals 430 may be transmitted and/or signals 432 may be received based on either or both edges in the one or more timing signals. Moreover, in some embodiments transmitting and receiving may be synchronous and/or asynchronous.

These timing signals may be generated based on one or more clock signals 424, which may be generated on-chip (for example, using a phase-locked loop and one or more reference signals provided by a frequency reference) and/or off-chip. Moreover, voltage levels and/or a voltage swing of the signals 430 may be based on voltages 428 provided by a power supply (not shown), and logic levels of the data 438 may be based on voltages 436 provided by the power supply. These voltages may be fixed or may be adjustable.

In some embodiments a period of the one or more timing signals, a skew or delay of the one or more timing signals, and/or one or more of the voltages 428 and 436 are adjusted based on a performance metric associated with communication to and/or from the memory controller 410. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

Moreover, while not shown in FIG. 3A, in some embodiments the memory controller 410 includes one or more additional transmit circuits coupled to a separate command link (or communication channel), which communicate commands (such as one or more piecewise-erase commands) to a memory device. This separate link: may be wireless, optical or wired; may have a lower data rate than the data rates associated with one or more of the sub-channels; may use one or more different carrier frequencies than are used in the data sub-channels; and/or may use a different modulation technique than is used in the data sub-channels. However, in some embodiments commands (such as a piecewise-erase command) are communicated using one or more of the transmit circuits 422.

Continuing the discussion of FIG. 3B, in memory device 460 signals 468 are received from another device (such as the memory controller 410 in FIG. 3A) using receive circuits (Rx) 470. These circuits may include detection circuits (such as slicer circuits) to determine data 480 from the signals 468. In some embodiments, data 480 is temporarily stored in memory buffer 478-1. Then, the data 480 is stored in one or more storage cells 482, for example, NAND Flash memory and/or NOR Flash memory. (Note that a data retention time of Flash memory may not be infinite because of phenomena such as charge leakage from a storage layer in a Flash memory device. Consequently, a data retention time of a storage cell in Flash memory can decrease as operations are performed on the storage cell.)

In response to a read command, data 484 is read back from one or more of the storage cells 482. Prior to being transmitted to the other device, this data may be temporarily stored in memory buffer 478-2. Then, the data 484 may be forwarded to transmit circuits (Tx) 486, and may be transmitted as (analog or digital) signals 490. In some embodiments, signals 490 and 468 are transmitted and received on the same link (such as a bidirectional link).

Note that timing of the forwarding, receiving, and/or transmitting may be gated by one or more timing signals provided by frequency synthesizer 474. Consequently, signals 490 may be transmitted and/or signals 468 may be received based on either or both edges in the one or more timing signals. In some embodiments, transmitting and receiving may be synchronous and/or asynchronous.

These timing signals may be generated based on one or more clock signals 472, which may be generated on-chip (for example, using a phase-locked loop and one or more reference signals provided by a frequency reference) and/or off-chip. Moreover, voltage levels and/or a voltage swing of the signals 490 may be based on voltages 488 provided by a power supply (not shown), and logic levels of the data 480 may be based on voltages 476 provided by the power supply. These voltages may be fixed or may be adjustable.

In some embodiments a period of the one or more timing signals, a skew or delay of the one or more timing signals, and/or one or more of the voltages 476 and 488 are adjusted based on a performance metric associated with communication to and/or from the memory device 460. This performance metric may include: a signal strength (such as a signal amplitude or a signal intensity), a mean square error (MSE) relative to a target (such as a detection threshold, a point in a constellation diagram, and/or a sequence of points in a constellation diagram), a signal-to-noise ratio (SNR), a bit-error rate (BER), a timing margin, and/or a voltage margin.

While not shown in FIG. 3B, in some embodiments the memory device 460 includes one or more additional receive circuits coupled to the separate command link (or communication channel), which receive commands (such as one or more piecewise-erase commands) from the other device. However, in some embodiments commands are received using one or more of the receive circuits 470.

In some embodiments of the memory controller 410 (FIG. 3A) and/or the memory device 460, additional techniques are used to recover or prevent the loss of data communicated between devices and/or the loss of stored data in storage cells 482. For example, at least a portion of the data communicated between devices and/or the stored data may include error-detection-code (EDC) information and/or error-correction-code (ECC) information. This EDC and/or ECC information may be pre-existing or may be dynamically generated (e.g., in real time).

In some embodiments, the ECC information includes a Bose-Chaudhuri-Hocquenghem (BCH) code. Note that BCH codes are a sub-class of cyclic codes. In exemplary embodiments, the ECC information includes: a cyclic redundancy code (CRC), a parity code, a Hamming code, a Reed-Solomon code, and/or another error checking and correction code.

Consequently, in some embodiments memory buffer 478-1 implements error detection and/or correction. For example, errors associated with communication may be detected by performing a multi-bit XOR operation in conjunction with one or more parity bits in the signals 468.

Moreover, control logic 412 (FIG. 3A) and/or 462 may take a variety of remedial actions in the event of an error or a degradation of one or more of the performance metrics during communication between the memory controller 410 (FIG. 3A) and the memory device 460. These remedial actions may include: re-transmitting previous data; transmitting previous or new data (henceforth referred to as data) using an increased transmission power than the transmission power used in a previous transmission; reducing the data rate in one or more of the sub-channels relative to the data rate used in a previous transmission; transmitting data with reduced intersymbol interference (for example, with blank intervals inserted before and/or after the data); transmitting data at a single clock edge (as opposed to dual-data-rate transmission); transmitting data with at least a portion of the data including ECC or EDC; transmitting data using a different encoding or modulation code than the encoding used in a previous transmission; transmitting data after a pre-determined idle time; transmitting data to a different receive circuit; and/or changing the number of sub-channels. Note that in some embodiments one or more of these adjustments are performed: continuously; as need based (for example, based on one or more of the performance metrics); and/or after a pre-determined time interval.

In some embodiments, the remedial action (and more generally adjustments to one or more of the sub-channels) is based on control information that is exchanged between the memory controller 410 (FIG. 3A) and the memory device 460. This control information may be exchanged using in-band communication (e.g., via the frequency bands used to communicate the signals 430 (FIG. 3A), 432 (FIG. 3A), 468, and 490 and/or out-of-band communication (for example, using the separate link).

In some embodiments, the remedial action and/or adjustments involve an auto-negotiation technique. During this auto-negotiation technique, a receive circuit in one of the devices may provide feedback to a transmit circuit in another device on the efficacy of any changes to the signals on a sub-channel. Based on this feedback, the transmit circuit may further modify these signals, e.g., may perform the remedial action.

Note that memory controller 410 (FIG. 3A) and/or memory device 460 may include fewer components or additional components. For example, signal lines coupling components may indicate multiple signal lines (or a bus). In some embodiments, memory controller 410 (FIG. 3A) and/or memory device 460 include pre-emphasis to compensate for losses and/or dispersion associated with inter-device communication. Similarly, in some embodiments a receiver of the signals includes equalization. Note that pre-emphasis and/or equalization may be implemented using feed-forward filters and/or decision-feedback-equalization circuits.

Components and/or functionality illustrated in memory controller 410 (FIG. 3A) and/or memory device 460 may be implemented using analog circuits and/or digital circuits. Furthermore, components and/or functionality in either of these communication circuits may be implemented using hardware and/or software. For example, control logic 412 (FIG. 3A) and/or 462 may include a processor or a processor core, and erase-management circuits 414 (FIG. 3A) and/or 464 may be implemented as instructions that are executed by the processor or the processor core. In some embodiments, the functions of memory controller 410 (FIG. 3A) are implemented directly by a host computer (e.g., there may not be a separate memory controller in a memory system, such as the memory system 300 in FIG. 2).

In some embodiments, memory device 460 is configured to perform a piecewise erase of storage cells. For example, optional control logic 462 may provide multiple piecewise-erase commands when an erase command is received by memory device 460, and data stored in one or more of the storage cells 482 may be erased by executing these multiple piecewise-erase commands.

In some embodiments functionality of the control logic 412 (FIG. 3A) and 462 and/or the erase-management circuits 414 (FIG. 3A) and 464 is provided by a processor in a computer system. For example, the processor may: provide multiple piecewise-erase commands; may track the number of issued piecewise-erase commands associated with a given storage cell; and/or make track a total erase time duration of the given storage cell.

Note that two or more components in memory controller 410 (FIG. 3A) and/or memory device 460 may be combined into a single component and/or the position of one or more components may be changed. In some embodiments, memory controller 410 (FIG. 3A) and/or memory device 460 are included in one or more integrated circuits on one or more semiconductor die. For example, memory controller 410 (FIG. 3A) and memory device 460 may be disposed on: the same die in an integrated circuit (e.g., a system-on-chip), on respective dice within a common package (e.g., a multi-die package), or on separate dice.

We now describe embodiments of processes for communicating and executing commands. FIG. 5A presents a flow chart illustrating an embodiment of a process 600 for communicating piecewise-erase commands, which may be performed by a memory component (such as a memory controller). During operation, the memory component generates multiple piecewise-erase commands to erase information stored in a storage cell formed within another memory component (such as a memory device) (610), where execution of a single one of the multiple piecewise-erase commands within the other memory component may be insufficient to erase the information stored in the storage cell. Next, the memory component transmits the multiple piecewise-erase commands to the other memory component (612). In some embodiments, the memory component optionally determines if the erasure of the information in the storage cell is complete (614).

Figure 5B:
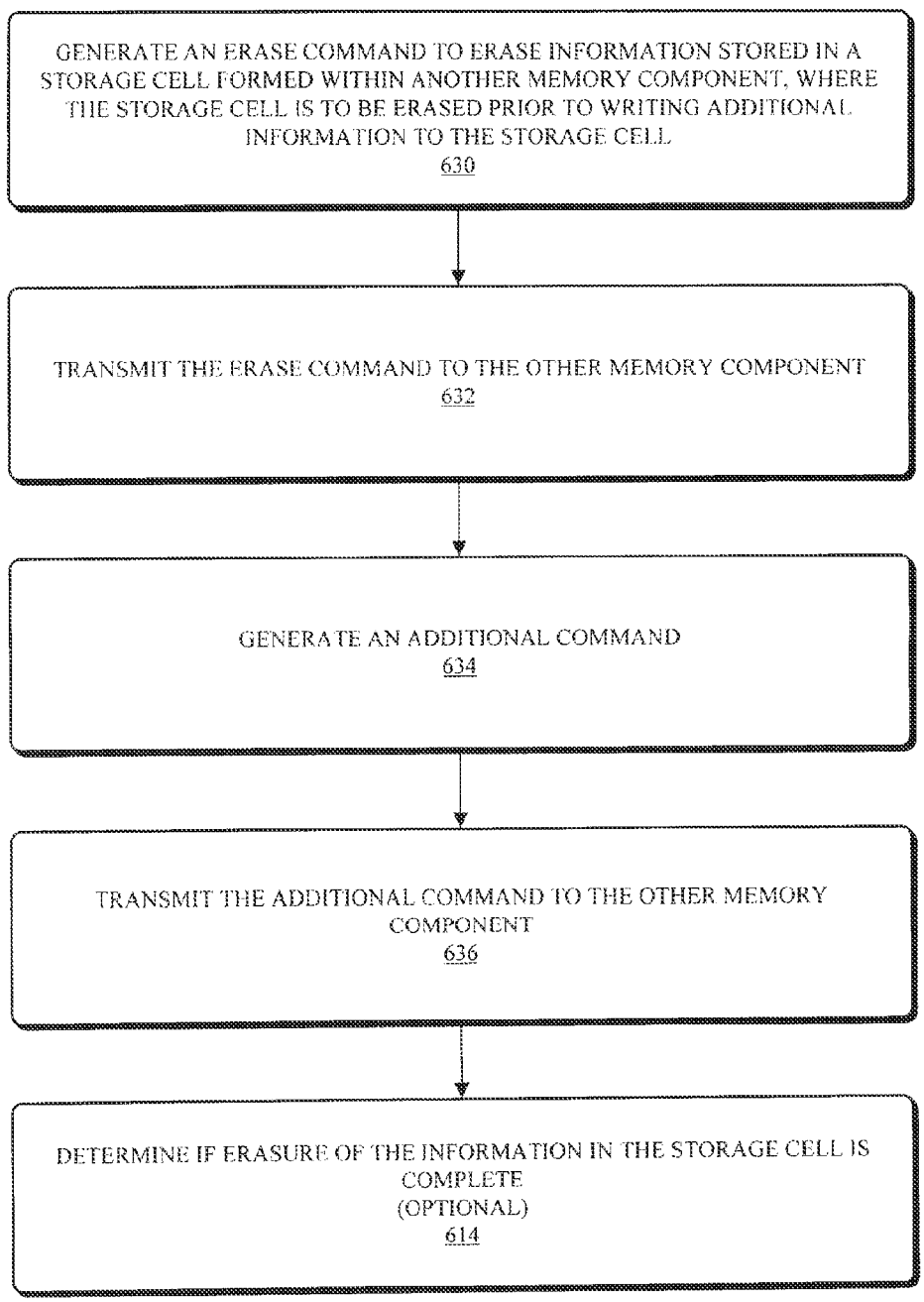
FIG. 5B is a flow chart illustrating an embodiment of a process for communicating piecewise-erase commands.

FIG. 5B presents a flow chart illustrating an embodiment of a process 620 for communicating piecewise-erase commands, which may be performed by a memory component (such as a memory controller). During operation, the memory component generates an erase command (such as a piecewise-erase command) to erase information stored in a storage cell formed within another memory component (such as a memory device) (630), where the storage cell is to be erased prior to writing additional information to the storage cell. Next, the memory component transmits the erase command to the other memory component (632). Then, the memory component generates an additional command (634), and transmits the additional command to the other memory component prior to the occurrence of an erase-complete condition (636). In some embodiments, the memory component optionally determines if the erasure of the information in the storage cell is complete (614).

Figure 5C:
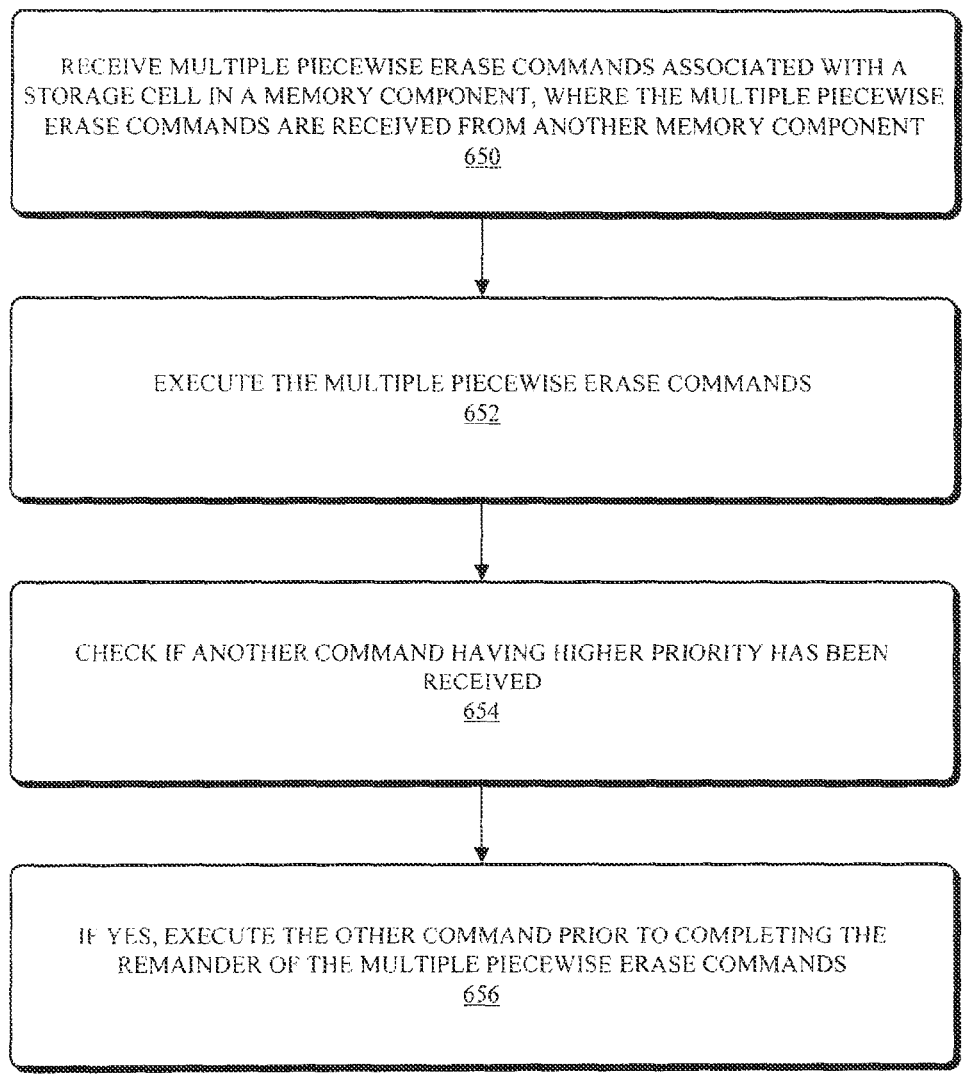
FIG. 5C is a flow chart illustrating an embodiment of a process for executing piecewise-erase commands.

FIG. 5C presents a flow chart illustrating an embodiment of a process 640 for executing piecewise-erase commands, which may be performed by a memory component (such as a memory device). During operation, the memory component receives multiple piecewise-erase commands associated with a storage cell in the memory component (650), where the multiple piecewise-erase commands are received from another memory component (such as a memory controller). Next, the memory component executes the multiple piecewise-erase commands (652). Note that execution of the multiple piecewise-erase commands may be sufficient to erase information stored in the storage cell but a given piecewise-erase command may be insufficient to erase the information stored in the storage cell.

In some embodiments, the memory component checks if another command having higher priority has been received (654), and if yes, the memory component executes the other command prior to completing the remainder of the multiple piecewise-erase commands (656). Note that the given piecewise-erase command may include information associated with a corresponding erase time duration.

FIG. 5D presents a flow chart illustrating an embodiment of a process 660 for executing piecewise-erase commands, which may be performed by a memory component (such as a memory device). During operation, the memory component receives an erase command associated with a NAND Flash storage cell in the memory component (670), where the erase command is received from another memory component (such as a memory controller). Next, the memory component executes the erase command as multiple piecewise-erase commands (672). Note that execution of the multiple piecewise-erase commands may be sufficient to erase information stored in the NAND Flash storage cell but a given piecewise-erase command may be insufficient to erase the information stored in the NAND Flash storage cell. Moreover, the memory component may interrupt a given piecewise-erase command with another operation to the same memory bank or erasure target.

Figure 6A:
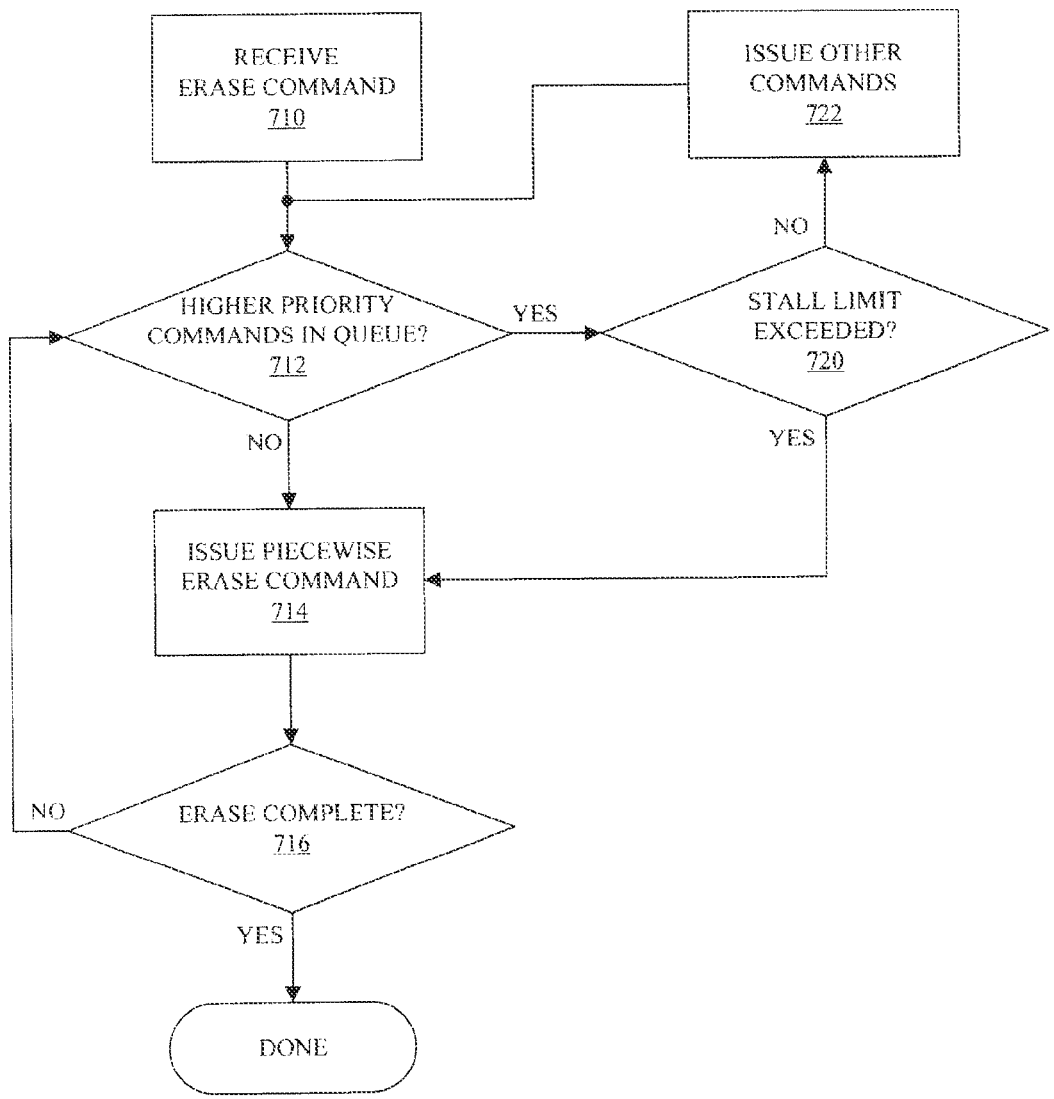
FIG. 6A is a flow chart illustrating an embodiment of a process for communicating commands.

FIG. 6A presents a flow chart illustrating an embodiment of a process 700 for communicating commands, which may be performed by a memory component (such as a memory controller). During this process, the memory component receives an erase command (710). If there are no higher priority commands in a queue (712), the memory component may issue a piecewise-erase command (714). Moreover, if the erase is completed (716), process 700 may terminate. Alternatively, operations 712-716 may iterate.

However, if there are other higher priority commands in the queue (712), the memory component may determine if a stall limit has been exceeded (720). If yes, the memory component may issue the piecewise-erase command (714). And if the stall limit has not been exceeded (720), the memory component may issue other commands (722).

Figure 6B:
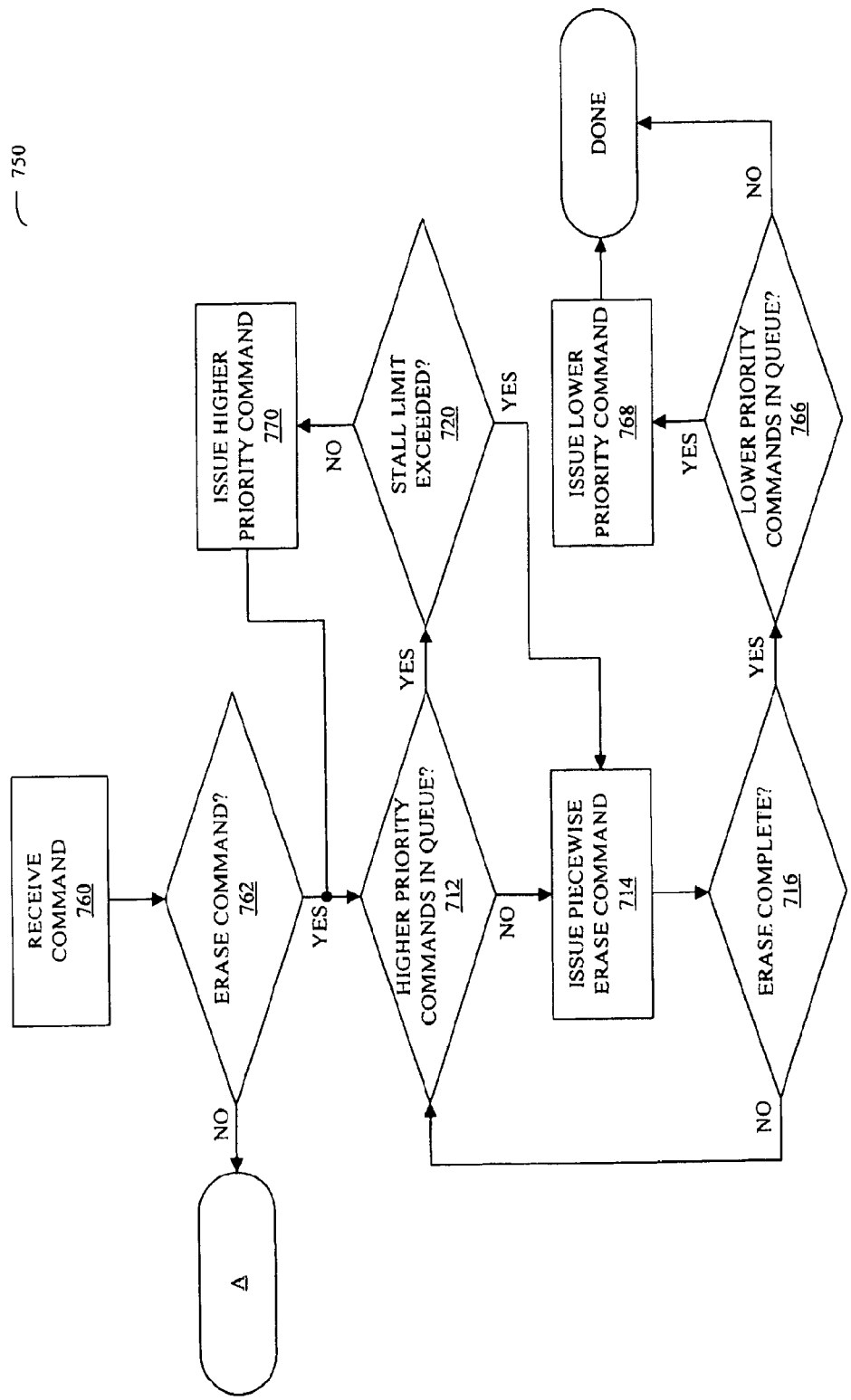
FIG. 6B is a flow chart illustrating an embodiment of a process for communicating commands.

A more general version of this process is shown in FIG. 6B, which presents a flow chart illustrating an embodiment of a process 750 for communicating commands, which may be performed by a memory component (such as a memory controller). During this process, the memory component receives a command (760). If this is an erase command (762), the memory component determines if there are higher priority commands in a queue (712). If not, the memory component may issue a piecewise-erase command (714) and may determine if the erase is completed (716). If the erase is not completed (716), operations 712-716 may iterate.

However, if there are other higher priority commands in the queue (712), the memory component may determine if a stall limit has been exceeded (720). If yes, the memory component may issue the piecewise-erase command (714). And if the stall limit has not been exceeded (720), the memory component may issue a higher priority command (770).

Additionally, if the erase is completed (716), the memory component may determine if there are lower priority commands in the queue (766). If yes, the memory component may issue the lower priority commands (768). Then, process 750 may terminate.

Figure 6C:
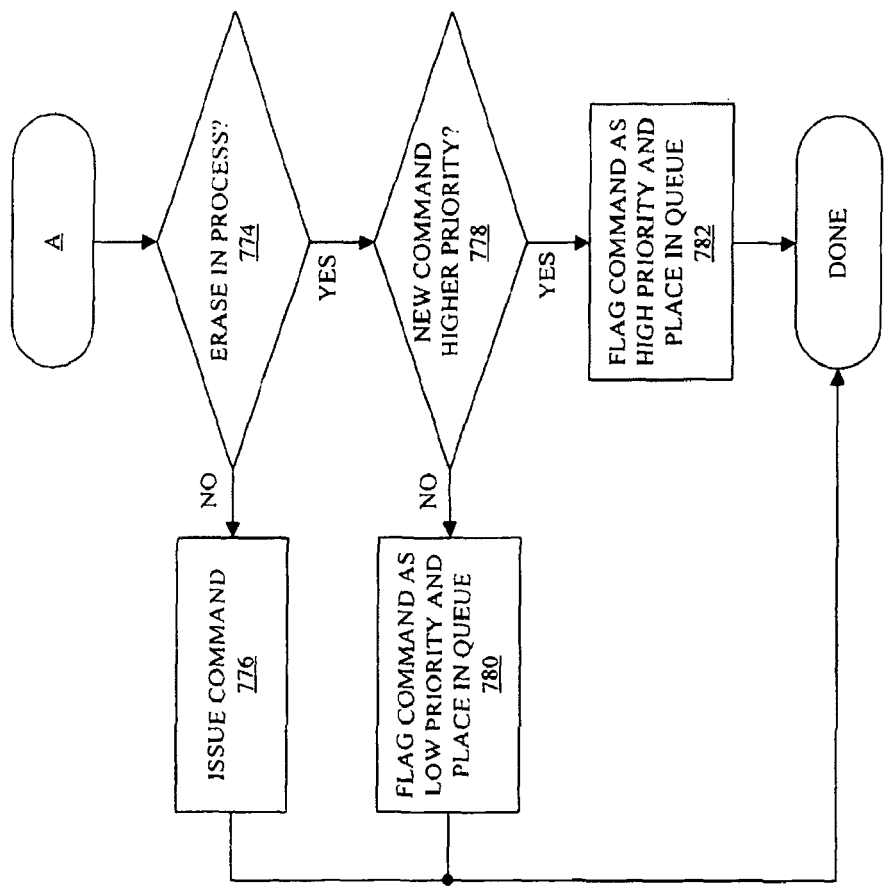
FIG. 6C is a flow chart illustrating an embodiment of a process for communicating commands.

Note that if the received command is not an erase command (762), the process may continue, as shown in FIG. 6C, which is a flow chart illustrating an embodiment of the process 750 for communicating commands. In particular, the memory component may determine if there is an erase in progress (774). If not, the memory component may issue a command (776) and process 750 may terminate.

Alternatively, the memory component may determine if there is a new command that has higher priority (778). If yes, the received command may be flagged as low priority and placed in the queue (780) and process 750 may terminate. If there is no new command with higher priority, the received command may be flagged as high priority and placed in the queue (782) and process 750 may terminate.

Figure 7A:
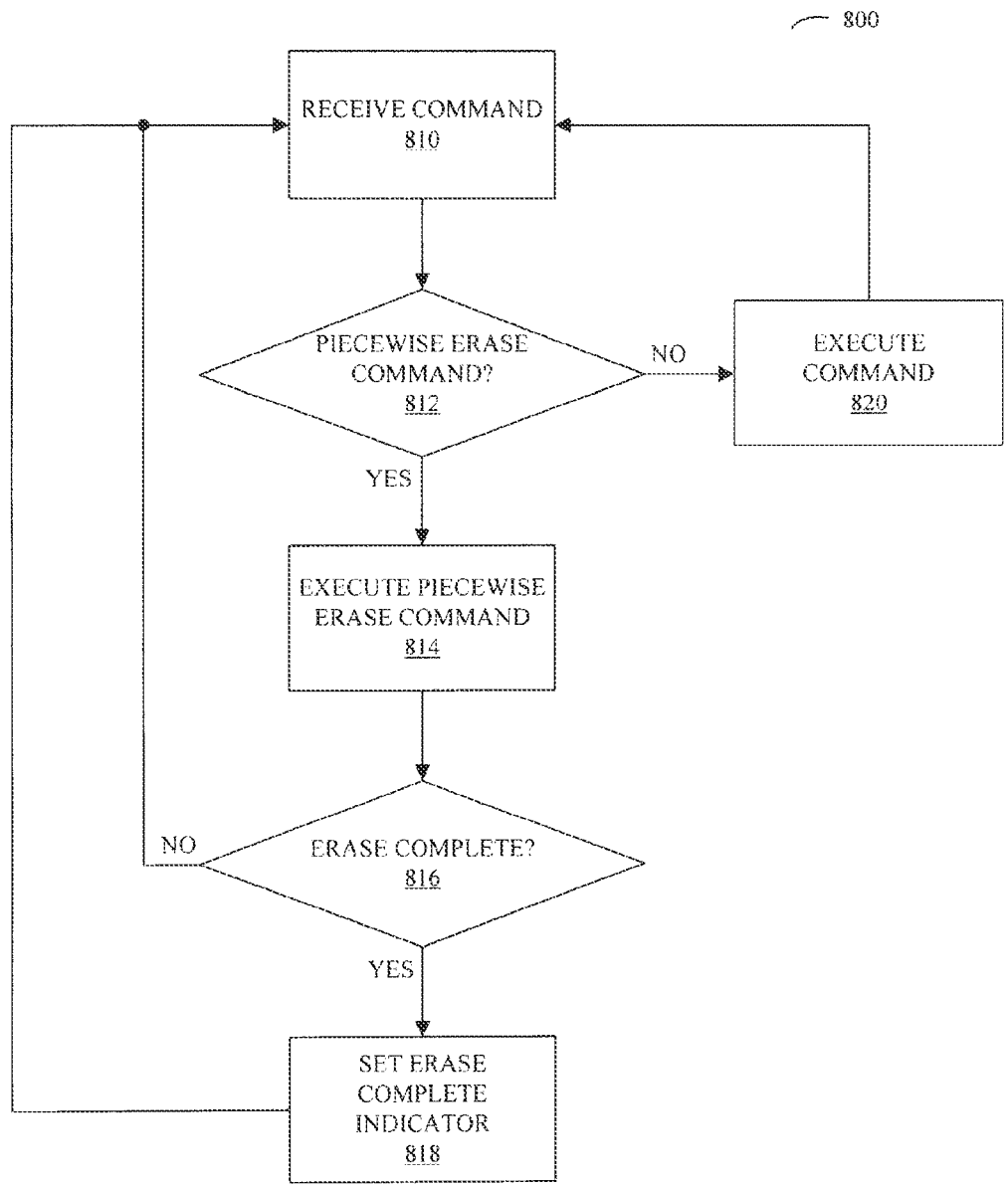
FIG. 7A is a flow chart illustrating an embodiment of a process for executing commands.

FIG. 7A presents a flow chart illustrating an embodiment of a process 800 for executing commands, which may be performed by a memory component (such as a memory device). During this process, the memory component may receive a command (810). If this received command is not a piecewise-erase command (812) the memory component may execute the command (820). Alternatively, if the received command is a piecewise-erase command (812), the memory component may execute the piecewise-erase command (814). Next, the memory component may determine if the erase is complete (816). If not, operations 810-814 may iterate. However, if the erase is complete (816), the memory component may set an erase-complete indicator (818).

Figure 7B:
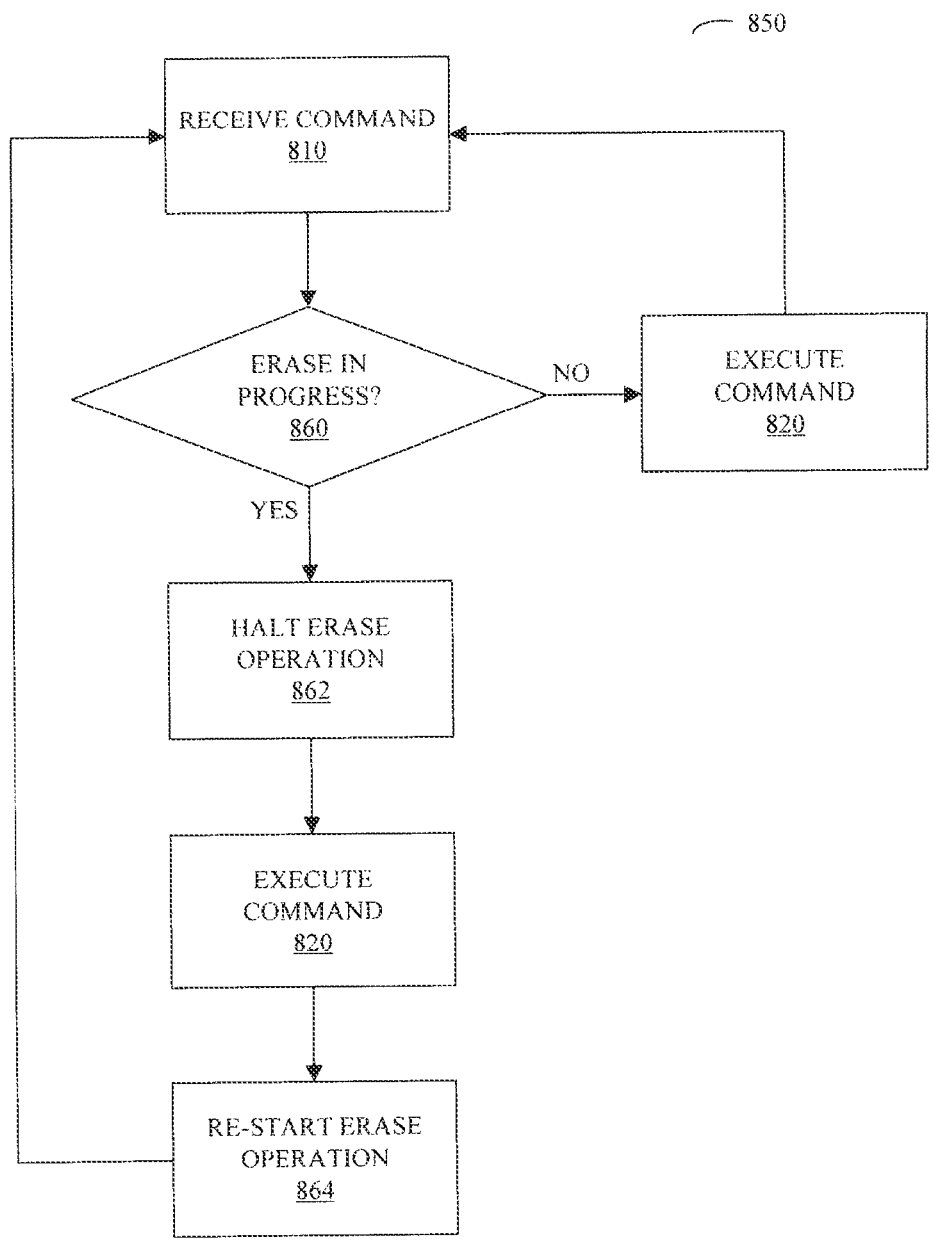
FIG. 7B is a flow chart illustrating an embodiment of a process for executing commands.

An erase interrupt process is shown in FIG. 7B, which presents a flow chart illustrating an embodiment of a process 850 for executing commands, which may be performed by a memory component (such as a memory device). During this process, the memory component receives the command (810) and determines if there is an erase in progress (860). If not, the memory component may execute the received command (820). If there is an erase in progress (860), the memory component may halt the erase operation (862) and may execute the command (820). Next, the memory component may re-start the erase operation (864).

In some embodiments of the processes 600 (FIG. 5A), 620 (FIG. 5B), 640 (FIG. 5C), 660 (FIG. 5D), 700 (FIG. 6A), 750 (FIGS. 6B and 6C), 800 (FIG. 7A) and/or 850 there may be fewer or additional operations. Moreover, two or more operations can be combined into a single operation, and/or a position of one or more operations may be changed.

Figure 8:
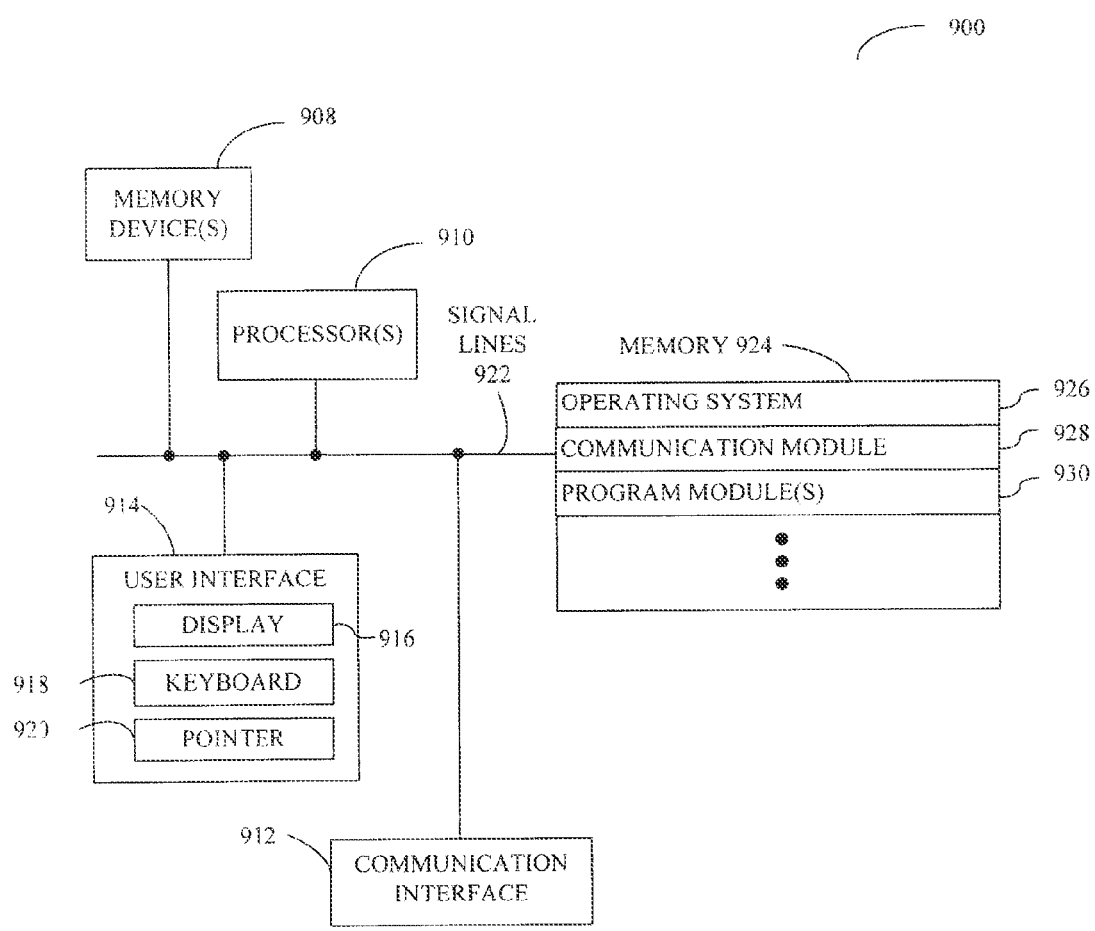
FIG. 8 is a block diagram illustrating an embodiment of a computer system.

Note that integrated circuits in the previously described embodiments, such as the memory controller and/or the memory device, may be included in computer systems. For example, FIG. 8 presents a block diagram illustrating an embodiment of a computer system 900. This computer system includes one or more processors 910, a communication interface 912, a user interface 914, and one or more signal lines 922 coupling these components together. Note that the one or more processing units 910 may support parallel processing and/or multi-threaded operation, the communication interface 912 may have a persistent communication connection, and the one or more signal lines 922 may constitute a communication bus. Moreover, the user interface 914 may include: a display 916, a keyboard 918, and/or a pointer 920, such as a mouse.

Computer system 900 may include memory 924, which may include high speed random access memory and/or non-volatile memory. More specifically, memory 924 may include: ROM, RAM, EPROM, EEPROM, Flash, one or more smart cards, one or more magnetic disc storage devices, and/or one or more optical storage devices. Memory 924 may store an operating system 926, such as SOLARIS, LINUX, UNIX, OSX, or Windows, that includes procedures (or a set of instructions) for handling various basic system services for performing hardware dependent tasks. Memory 924 may also store procedures (or a set of instructions) in a communication module 928. The communication procedures may be used for communicating with one or more computers and/or servers, including computers and/or servers that are remotely located with respect to the computer system 900.

Memory 924 may also include the one or more program modules (of sets of instructions) 930. Instructions in the program modules 930 in the memory 924 may be implemented in: a high-level procedural language, an object-oriented programming language, and/or in an assembly or machine language. The programming language may be compiled or interpreted, e.g., configurable or configured to be executed by the one or more processing units 910.

Computer system 900 may include one or more memory devices 908 (such as memory modules and/or memory systems) that include integrated circuits with storage cells that may be erased using multiple piecewise-erase commands, as described in the previous embodiments. For example, the memory devices 908 may be included in the main memory of the computer system 900. Note that in some embodiments data stored in storage cells in one or more of the memory devices 908 is piecewise erased based on instructions executed by one or more of the processors 910.

Computer system 900 may include fewer components or additional components. Moreover, two or more components can be combined into a single component, and/or a position of one or more components may be changed. In some embodiments, the functionality of the computer system 900 may be implemented more in hardware and less in software, or less in hardware and more in software, as is known in the art.

Although the computer system 900 is illustrated as having a number of discrete items, FIG. 8 is intended to be a functional description of the various features that may be present in the computer system 900 rather than as a structural schematic of the embodiments described herein. In practice, and as recognized by those of ordinary skill in the art, the functions of the computer system 900 may be distributed over a large number of servers or computers, with various groups of the servers or computers performing particular subsets of the functions. In some embodiments, some or all of the functionality of the computer system 900 may be implemented in one or more application specific integrated circuits (ASICs) and/or one or more digital signal processors (DSPs).

Devices and circuits described herein may be implemented using computer aided design tools available in the art, and embodied by computer-readable files containing software descriptions of such circuits. These software descriptions may be: at behavioral, register transfer, logic component, transistor and layout geometry level descriptions. Moreover, the software descriptions may be stored on storage media or communicated by carrier waves.

Data formats in which such descriptions may be implemented include, but are not limited to: formats supporting behavioral languages like C, formats supporting register transfer level RTL languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 9:
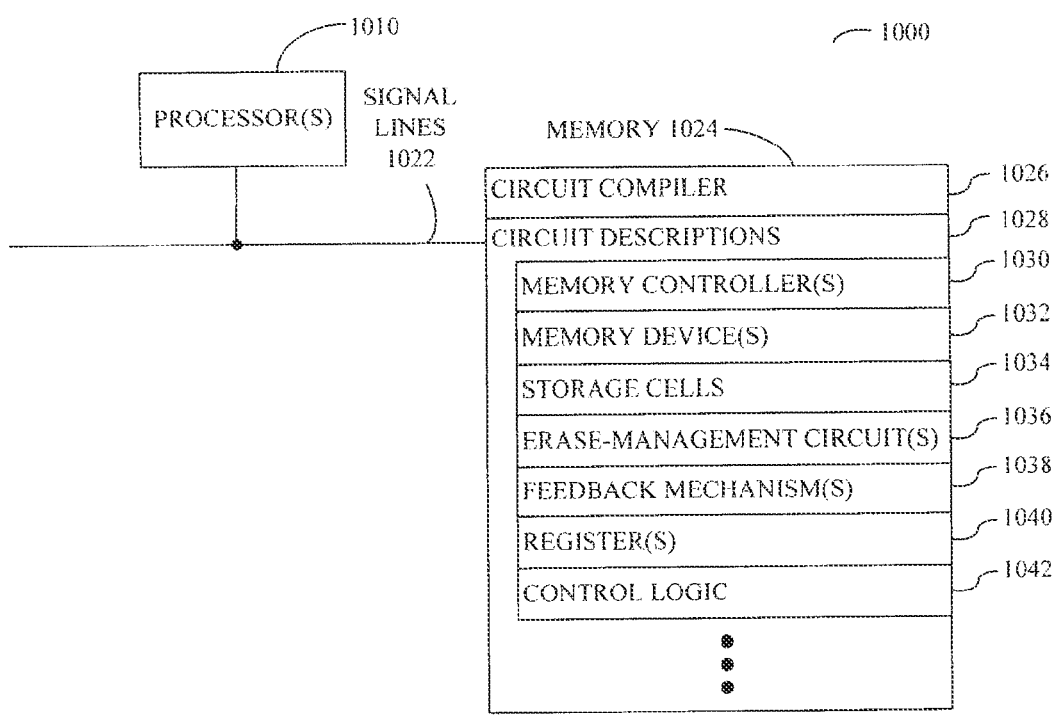
FIG. 9 is a block diagram illustrating an embodiment of a system.

FIG. 9 presents a block diagram illustrating an embodiment of a system 1000 that stores such computer-readable files. This system may include at least one data processor or central processing unit (CPU) 1010, memory 1024 and one or more signal lines or communication busses 1022 for coupling these components to one another. Memory 1024 may include high-speed random access memory and/or non-volatile memory, such as: ROM, RAM, EPROM, EEPROM, Flash, one or more smart cards, one or more magnetic disc storage devices, and/or one or more optical storage devices.

Memory 1024 may store a circuit compiler 1026 and circuit descriptions 1028. Circuit descriptions 1028 may include descriptions for the circuits, or a subset of the circuits discussed above with respect to FIGS. 1-7. In particular, circuit descriptions 1028 may include circuit descriptions of: one or more memory controllers 1030, one or more memory devices 1032, one or more storage cells 1034, one or more erase-management circuits 1036, one or more feedback mechanisms 1038, one or more registers 1040, and/or control logic 1042 (or a set of instructions).

In some embodiments, system 1000 includes fewer or additional components. Moreover, two or more components can be combined into a single component, and/or a position of one or more components may be changed.

Figure 10:
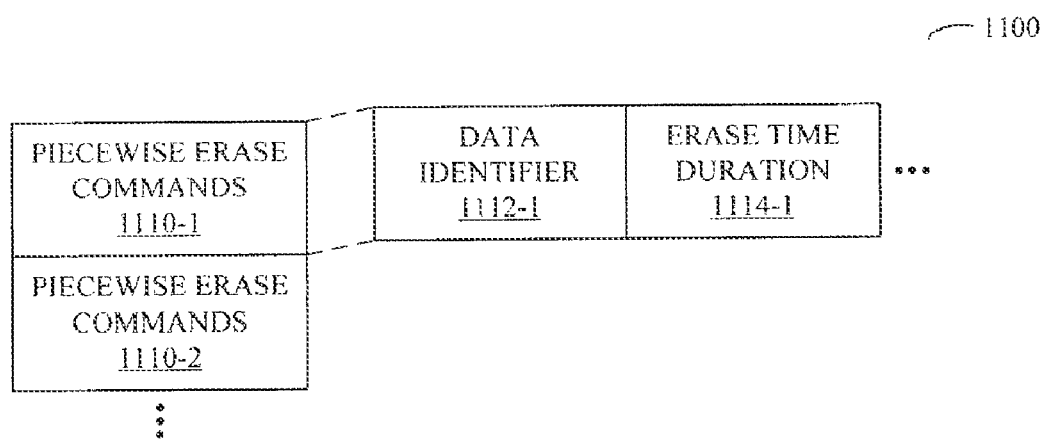
FIG. 10 is a block diagram illustrating an embodiment of a data structure.

We now describe data structures that may be used in the preceding embodiments (for example, in conjunction with an erase-management circuit). FIG. 10 presents a block diagram illustrating an embodiment of a data structure 1100. This data structure may include information about one or more piecewise-erase commands 1110. For example, the piecewise-erase commands 1110 may correspond to different storage cells in a memory device. A given piecewise-erase command, such as piecewise-erase command 1110-1, may include a data identifier 1112-1 (such as a storage cell or a data attribute) and an erase time duration 1114-1.

Note that that in some embodiments of the data structures 1100 there may be fewer or additional components. Moreover, two or more components can be combined into a single component, and/or a position of one or more components may be changed.

In some embodiments, a first circuit includes control logic that generates multiple piecewise-erase commands to erase information stored in a storage cell of a memory device formed within another circuit. Note that execution of a single one of the multiple piecewise-erase commands within the memory device may be insufficient to erase the information stored in the storage cell. Moreover, the first circuit includes an interface that receives the multiple piecewise-erase commands from the control logic and that transmits the multiple piecewise-erase commands to the memory device.

Note that an erase duration associated with the given piecewise-erase command may be less than a total erase duration used to erase the storage cell. Moreover, the erase duration associated with the given piecewise-erase command may be fixed.

In some embodiments, the erase duration associated with the given piecewise-erase command is specified by a register setting in the memory device.

In some embodiments, the erase duration associated with the given piecewise-erase command is variable, and the given piecewise-erase command includes information associated with the erase duration.

Note that in some embodiments the first circuit includes a memory controller.

Moreover, in some embodiments an operation mode of the control logic is selectable. In one operation mode, the control logic generates the multiple piecewise-erase commands, and in another operation mode the control logic generates a single erase command, execution of which within the memory device may be sufficient to erase the storage cell.

In some embodiments, a data retention time of the storage cell decreases as operations are performed on the storage cell. For example, the storage cell may include Flash memory, such as NAND or NOR Flash memory.

Moreover, the storage cell may include a block of storage cells. Additionally, the storage cell may include a storage cell in a non-volatile memory. In some embodiments, the storage cell may include a charge-storage layer bounded by insulators.

In some embodiments, the first circuit includes an erase management circuit that tracks a number of piecewise-erase commands or an erase duration of the multiple piecewise-erase commands to erase the storage cell.

In some embodiments, a fixed number of piecewise-erase commands are generated to erase a given storage cell.

In some embodiments, the control logic generates an additional command and the interface transmits the additional command to the memory device prior to the occurrence of an erase-complete condition. For example, the additional command may interrupt an erase in progress in the memory device. Note that the erase-complete condition may include receipt of an erase-complete indicator from the memory device or a pre-determined time for the memory device to process the piecewise-erase commands.

Another embodiment provides a first integrated circuit disposed on a semiconductor die that includes the first circuit.

Another embodiment provides a first system that includes the first circuit.

Another embodiment provides a computer-readable medium that includes data that specifies the first circuit.

Another embodiment provides a first method for communicating piecewise-erase commands, which may be performed by a memory component (such as a memory controller). During operation, the memory component generates multiple piecewise-erase commands to erase information stored in a storage cell formed within another memory component (such as a memory device), where execution of a single one of the multiple piecewise-erase commands within the other memory component may be insufficient to erase the information stored in the storage cell. Next, the memory component transmits the multiple piecewise-erase commands to the other memory component.

Another embodiment provides a second circuit that includes control logic that generates an erase command to erase information stored in a storage cell of a memory device formed within the other circuit, and that generates an additional command. Note that the storage cell is to be erased prior to writing additional information to the storage cell. Moreover, the second circuit includes an interface, which is coupled to a link, that transmits the erase command to the memory device and, then, that transmits the additional command to the memory device prior to the occurrence of an erase-complete condition.

In some embodiments, the additional command interrupts an erase in progress in the memory device when executed by the memory device.

Note that the erase-complete condition may include receipt of an erase-complete indicator from the memory device or may include a pre-determined time for the memory device to process the erase command.

Moreover, in some embodiments the erase command includes multiple piecewise-erase commands. Note that execution of a single one of the multiple piecewise-erase commands within the memory device may be insufficient to erase the information stored in the storage cell. However, execution of multiple piecewise-erase commands within the memory device may be sufficient to erase the information stored in the storage cell.

In some embodiments, the second circuit includes an erase management circuit that tracks a number of piecewise-erase commands or an erase duration of piecewise-erase commands associated with the storage cell, which are transmitted to the memory device. Note that a fixed number of piecewise-erase commands may be generated to erase a given storage cell.

In some embodiments, an erase duration associated with a given piecewise-erase command is less than a total erase duration used to erase the storage cell. Note that the erase duration associated with the given piecewise-erase command may be fixed. Moreover, in some embodiments the erase duration associated with the given piecewise-erase command is specified by a register setting in the memory device.

In some embodiments, the erase duration associated with the given piecewise-erase command is variable, and the given piecewise-erase command includes information associated with the erase duration.

Note that in some embodiments the first circuit includes a memory controller.

Moreover, in some embodiments an operation mode of the control logic is selectable. In one operation mode, the control logic generates the multiple piecewise-erase commands (which can include the erase command), and in another operation mode the control logic generates a single erase command (which can be the erase command), execution of which within the memory device may be sufficient to erase the storage cell.

In some embodiments, a data retention time of the storage cell decreases as operations are performed on the storage cell. For example, the storage cell may include Flash memory, such as NAND or NOR Flash memory.

Moreover, the storage cell may include a block of storage cells. Additionally, the storage cell may include a storage cell in a non-volatile memory. In some embodiments, the storage cell may include a charge-storage layer bounded by insulators.

Another embodiment provides a second integrated circuit disposed on a semiconductor die that includes the second circuit.

Another embodiment provides a second system that includes the second circuit.

Another embodiment provides a computer-readable medium that includes data that specifies the second circuit.

Another embodiment provides a second method for communicating piecewise-erase commands, which may be performed by a memory component (such as a memory controller). During operation, the memory component generates an erase command to erase information stored in a storage cell formed within another memory component (such as a memory device), where the storage cell is to be erased prior to writing additional information to the storage cell. Next, the memory component transmits the erase command to the other memory component. Then, the memory component generates an additional command, and transmits the additional to the other memory component prior to the occurrence of an erase-complete condition.

Another embodiment provides a third circuit that includes a storage cell, and an interface, which is coupled to a link, that receives multiple piecewise-erase commands associated with the storage cell from another circuit (such as the first circuit or the second circuit). Moreover, the third circuit includes control logic, coupled to the interface and the storage cell, that executes the multiple piecewise-erase commands. Note that execution of the multiple piecewise-erase commands may be sufficient to erase information stored in the storage cell but a given piecewise-erase command may be insufficient to erase the information stored in the storage cell.

In some embodiments, an erase duration associated with a given piecewise-erase command is less than a total erase duration used to erase the storage cell. Note that the erase duration associated with the given piecewise-erase command may be fixed.

In some embodiments, the erase duration associated with the given piecewise-erase command is specified by a register setting in the third circuit.

However, the erase duration associated with the given piecewise-erase command may be variable. Moreover, the given piecewise-erase command may include information associated with the erase duration.

In some embodiments, the interface receives an additional command and the control logic executes the additional command prior to completing the multiple piecewise-erase commands, thereby interrupting an erase in progress in the third circuit. For example, the interface may receive another command having a priority higher than the multiple piecewise-erase commands and the control logic may execute the other command prior to completing the multiple piecewise-erase commands.

In some embodiments, a data retention time of the storage cell decreases as operations are performed on the storage cell. For example, the storage cell may include Flash memory, such as NAND or NOR Flash memory.

Moreover, the storage cell may include a block of storage cells. Additionally, the storage cell may include a storage cell in a non-volatile memory. In some embodiments, the storage cell may include a charge-storage layer bounded by insulators.

In some embodiments, the third circuit includes an erase management circuit that tracks a number of piecewise-erase commands or an erase duration of the multiple piecewise-erase commands associated with the storage cell, which are received by the third circuit. Note that a fixed number of piecewise-erase commands may be received to erase a given storage cell.

In some embodiments, the third circuit includes a memory device.

In some embodiments, the third circuit includes a feedback mechanism to monitor an erase state of the storage cell. This feedback circuit may set a register bit to indicate completion of the erasure of the information. Moreover, the feedback circuit may indicate that the erasure of the information is complete via a link in a channel.

Another embodiment provides a third integrated circuit disposed on a semiconductor die that includes the third circuit.

Another embodiment provides a third system that includes the third circuit.

Another embodiment provides a computer-readable medium that includes data that specifies the third circuit.

Another embodiment provides a third method for executing piecewise-erase commands, which may be performed by a memory component (such as a memory device). During operation, the memory component receives multiple piecewise-erase commands associated with a storage cell in the memory component, where the multiple piecewise-erase commands are received from another memory component (such as a memory controller). Next, the memory component executes the multiple piecewise-erase commands. Note that execution of the multiple piecewise-erase commands may be sufficient to erase information stored in the storage cell but a given piecewise-erase command may be insufficient to erase the information stored in the storage cell.

In some embodiments, the memory component checks if another command having higher priority has been received, and if yes, the memory component executes the other command prior to completing the remainder of the multiple piecewise-erase commands. Note that the given piecewise-erase command may include information associated with a corresponding erase duration.

Another embodiment provides a fourth circuit that includes a NAND Flash storage cell, and an interface, which coupled to a link, that receives from another circuit an erase command associated with the NAND Flash storage cell. Moreover, the fourth circuit may include control logic, coupled to the interface and the NAND Flash storage cell, that executes the erase command as multiple piecewise-erase commands. Note that execution of the multiple piecewise-erase commands may be sufficient to erase information stored in the NAND Flash storage cell but a given piecewise-erase command may be insufficient to erase the information stored in the NAND Flash storage cell.

In some embodiments, an erase duration associated with the given piecewise-erase command is less than a total erase duration used to erase the NAND Flash storage cell. Note that the erase duration associated with the given piecewise-erase command may be fixed. However, in some embodiments the erase duration associated with the given piecewise-erase command is variable.

Moreover, in some embodiments the erase duration associated with the given piecewise-erase command is specified by a register setting in the fourth circuit. In some embodiments, the given piecewise-erase command includes information associated with the erase duration.

In some embodiments, the interface receives an additional command and the control logic executes the additional command to interrupt an erase in progress prior to completing the multiple piecewise-erase commands. For example, the interface may receive another command having a priority higher than the multiple piecewise-erase commands and the control logic may execute the other command prior to completing the multiple piecewise-erase commands.

In some embodiments, the fourth circuit includes an erase management circuit that tracks a number of piecewise-erase commands or an erase duration of the multiple piecewise-erase commands associated with the NAND Flash storage cell.

Moreover, the control logic may generate a fixed number of piecewise-erase commands to erase a given NAND Flash storage cell.

In some embodiments, the fourth circuit includes a memory device.

In some embodiments, the fourth circuit includes a feedback mechanism to monitor an erase state of the NAND Flash storage cell.

In some embodiments, a data retention time of the NAND Flash storage cell decreases as operations are performed on the NAND Flash storage cell.

Moreover, the NAND Flash storage cell may include a block of storage cells. Additionally, the NAND Flash storage cell may include a storage cell in a non-volatile memory. In some embodiments, the NAND Flash storage cell may include a charge-storage layer bounded by insulators.

Another embodiment provides a fourth integrated circuit disposed on a semiconductor die that includes the fourth circuit.

Another embodiment provides a first system that includes the fourth circuit.

Another embodiment provides a computer-readable medium that includes data that specifies the fourth circuit.

Another embodiment provides a fourth method for executing an erase command, which may be performed by a memory component (such as a memory device). During operation, the memory component receives an erase command associated with a NAND Flash storage cell in the memory component, where the erase command is received from another memory component (such as a memory controller). Next, the memory component executes the erase command as multiple piecewise-erase commands. Note that execution of the multiple piecewise-erase commands may be sufficient to erase information stored in the NAND Flash storage cell but a given piecewise-erase command may be insufficient to erase the information stored in the NAND Flash storage cell.

Another embodiment provides a system that includes the memory controller (which may include the first circuit and/or the second circuit) and the memory device (which may include the third circuit and/or the fourth circuit) coupled to the memory controller. This memory device may include one or more storage cells. Moreover, in some embodiments the system is implemented on a chip package that includes an integrated circuit with the memory controller and the memory device or separate integrated circuits with, respectively, the memory controller and the memory device.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A circuit, comprising:
    a memory including multiple storage cells;
    an interface, which is to couple to a link, to receive multiple piecewise-erase commands associated with a given storage cell from another circuit external to the circuit;
    control logic, coupled to the interface and the memory, to execute the multiple piecewise-erase commands, wherein execution of the multiple piecewise-erase commands is sufficient to erase information stored in the given storage cell while execution of a single piecewise-erase command is insufficient to erase the information stored in the given storage cell; and
    a feedback circuit, coupled to the memory and the control logic, to monitor an erase state of the given storage cell and to generate an indication in response to the information stored in the given storage cell having been erased.

2. The circuit of claim 1, wherein an erase duration associated with a given piecewise-erase command is less than a total erase duration associated with the given storage cell.

3. The circuit of claim 2, wherein the erase duration associated with the given piecewise-erase command is fixed.

4. The circuit of claim 2, further comprising a register to store a setting that specifies the erase duration associated with the given piecewise-erase command.

5. The circuit of claim 2, wherein the erase duration associated with the given piecewise-erase command is variable.

6. The circuit of claim 2, wherein the given piecewise-erase command includes information associated with the erase duration of the given piecewise-erase command.

7. The circuit of claim 1, wherein the interface is to receive another command and the control logic is to execute the other command prior to completing the multiple piecewise-erase commands, thereby interrupting an erase in progress in the circuit.

8. The circuit of claim 7, wherein the other command has a higher priority than the multiple piecewise-erase commands.

9. The circuit of claim 1, wherein the memory includes Flash memory.

10. The circuit of claim 1, further comprising an erase management circuit to track a number of piecewise-erase commands associated with the given storage cell that are received by the circuit.

11. The circuit of claim 1, further comprising an erase management circuit to track a total erase duration of the multiple piecewise-erase commands.

12. The circuit of claim 1, wherein a fixed number of piecewise-erase commands are used to erase the given storage cell.

13. The circuit of claim 1, further comprising a register to store a register bit, wherein the feedback circuit sets the register bit to indicate completion of the erasure of the given storage cell.

14. A system, comprising:
    a first circuit to generate and to provide multiple piecewise-erase commands associated with a given storage cell in a second circuit external to the first circuit;
    a link coupled to the first circuit; and
    the second circuit coupled to the link, wherein the second circuit includes:
    a memory including multiple storage cells;
    an interface, which is coupled to the link, to receive the multiple piecewise-erase commands;
    control logic, coupled to the interface and the memory, to execute the multiple piecewise-erase commands, wherein execution of the multiple piecewise-erase commands is sufficient to erase information stored in the given storage cell while execution of a single piecewise-erase command is insufficient to erase the information stored in the given storage cell; and
    a feedback circuit, coupled to the memory and the control logic, to monitor an erase state of the given storage cell and to generate an indication in response to the information stored in the given storage cell having been erased.

15. A method for executing multiple piecewise-erase commands, comprising:
    receiving the multiple piecewise-erase commands associated with a given storage cell in a memory in a circuit, wherein the multiple piecewise-erase commands are received from another circuit external to the circuit;
    executing the multiple piecewise-erase commands, wherein execution of the multiple piecewise-erase commands is sufficient to erase information stored in the given storage cell while execution of a single piecewise-erase command is insufficient to erase the information stored in the given storage cell;
    monitoring an erase state of the given storage cell using a feedback circuit; and
    generating an indication in response to the information stored in the given storage cell having been erased.

16. The method of claim 15, wherein the method further comprises:
    receiving an another command from the other circuit; and
    executing the other command prior to completing the multiple piecewise-erase commands, thereby interrupting an erase in progress in the circuit.

17. The method of claim 15, wherein the method further comprises tracking a number of piecewise-erase commands associated with the given storage cell that are received by the circuit.

18. The method of claim 15, wherein the method further comprises tracking a total erase duration of the multiple piecewise-erase commands.

19. The method of claim 15, wherein the method further comprises storing a register bit to indicate completion of the erasure of the given storage cell.

20. A circuit, comprising:
control logic to select an operation mode of the circuit, wherein in a first operation mode the control logic is to generate a single erase command that, when executed by another circuit external to the circuit, is sufficient to erase information stored in a given storage cell in a memory included in the other circuit; and wherein in a second operation mode the control logic generates multiple piecewise-erase commands that, when executed by the other circuit, are sufficient to erase the information stored in the given storage cell, while a single piecewise-erase command, when executed by the other circuit, is insufficient to erase the information stored in the given storage cell; and
an interface, coupled to the control logic and which is to couple to a link, to receive the single erase command from the control logic in the first operation mode or the multiple piecewise-erase commands from the control logic in the second operation mode, and to transmit the single erase command or the multiple piecewise-erase commands to the other circuit via the link.

21. The circuit of claim 20, wherein the erase duration associated with a given piecewise-erase command is variable; and
wherein the given piecewise-erase command includes information associated with the erase duration.

22. The circuit of claim 20, wherein the storage cell includes Flash memory.

23. The circuit of claim 20, further comprising an erase management circuit, coupled to the control logic, to track a number of piecewise-erase commands associated with the given storage cell in the second operation mode.

24. The circuit of claim 20, further comprising an erase management circuit, coupled to the control logic, to track a total erase duration of the multiple piecewise-erase commands associated with the given storage cell in the second operation mode.

25. The circuit of claim 20, wherein, prior to the occurrence of an erase-complete condition associated with the given storage cell in the second operation mode, the control logic is to generate another command that is to interrupt an erase in progress in the other circuit; and
wherein, prior to the occurrence of the erase-complete condition, the interface is to transmit the other command to the other circuit.

26. The circuit of claim 25, wherein the interface is to receive an erase-complete indicator from the other circuit when the given storage cell is erased; and
wherein the erase-complete condition includes receipt of the erase-complete indicator.

* * * * *